United States Patent
Taniguchi

(10) Patent No.: US 10,083,935 B2
(45) Date of Patent: Sep. 25, 2018

(54) SEMICONDUCTOR DEVICE AND A MANUFACTURING METHOD OF THE SEMICONDUCTOR DEVICE

(71) Applicant: FUJI ELECTRIC CO., LTD., Kanagawa (JP)

(72) Inventor: Katsumi Taniguchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/638,403

(22) Filed: Jun. 30, 2017

(65) Prior Publication Data

US 2018/0053744 A1   Feb. 22, 2018

(30) Foreign Application Priority Data

Aug. 18, 2016 (JP) .................. 2016-160894

(51) Int. Cl.
| | |
|---|---|
| *H05K 1/18* | (2006.01) |
| *H01L 25/065* | (2006.01) |
| *H01L 25/00* | (2006.01) |
| *H05K 7/02* | (2006.01) |

(52) U.S. Cl.
CPC .......... *H01L 25/0655* (2013.01); *H01L 25/50* (2013.01); *H05K 7/02* (2013.01)

(58) Field of Classification Search
USPC ....................................... 361/764, 761, 718
See application file for complete search history.

(56) References Cited

U.S. PATENT DOCUMENTS

| | | | |
|---|---|---|---|
| 7,718,900 B2 * | 5/2010 | Takaike ................ | H05K 1/189 174/254 |
| 2009/0230487 A1 * | 9/2009 | Saitoh .................. | B81B 7/0061 257/419 |
| 2010/0295187 A1 | 11/2010 | Tsuruoka et al. | |
| 2014/0367736 A1 | 12/2014 | Iizuka et al. | |

FOREIGN PATENT DOCUMENTS

| | | |
|---|---|---|
| JP | 2011-077280 A | 4/2011 |
| JP | 2015-198227 A | 11/2015 |
| WO | 2009/081723 A1 | 7/2009 |
| WO | 2013/146212 A1 | 10/2013 |

* cited by examiner

*Primary Examiner* — Andargie M Aychillhum

(57) ABSTRACT

A semiconductor device including semiconductor units 20A to 20C that each include semiconductor elements 12 and 13, a unit case 11 sealing the semiconductor elements, and a first unit terminal 16 exposed inside a first recessed portion 11a provided in a top surface of the unit case; a first unit connection portion 40a including, in correspondence with each of the semiconductor units, a first connection terminal 43S connected to the first unit terminal, a first connection conductor $43S_0$ connected between a plurality of the first connection terminals, and a first connection conductor sealing portion $40a_0$ sealing the first connection conductor while exposing the first connection terminals; and first recessed sealing portions 45a that each, in correspondence with each of the semiconductor units, seal each connection portion between the first unit terminal and the first connection terminal inside a recess of the first recessed portion.

17 Claims, 19 Drawing Sheets

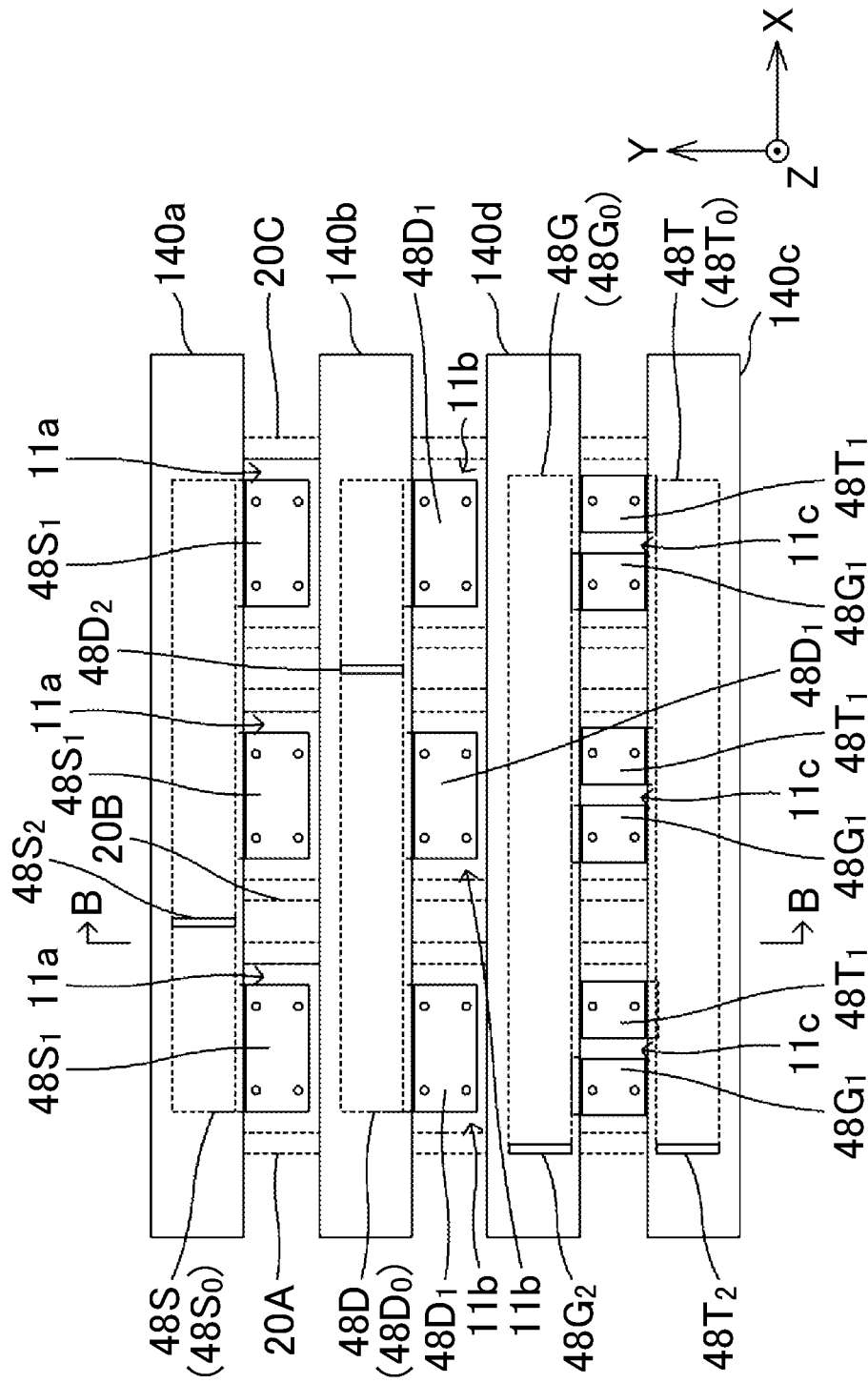

SEMICONDUCTOR DEVICE AND A MANUFACTURING METHOD OF THE SEMICONDUCTOR DEVICE

The contents of the following Japanese patent application are incorporated herein by reference:
NO. 2016-160894 filed on Aug. 18, 2016.

BACKGROUND

1. Technical Field

The present invention relates to a semiconductor device and a semiconductor device manufacturing method.

2. Related Art

In recent years, development has been progressing for power semiconductor modules (referred to simply as semiconductor modules or semiconductor units) having next-generation semiconductor elements including compound semiconductor elements such as silicon carbide (SiC) semiconductor elements and gallium nitride (GaN) semiconductors mounted thereon. The SiC elements and GaN elements have wide bandgaps relative to conventional silicon (Si) semiconductor elements and have high withstand voltage due to having high insulation breakdown electric field strength, and can be used to realize small-scale semiconductor modules capable of operating at high speed and with high efficiency because these elements can be used to make the impurity concentration higher and the active layer thinner.

A semiconductor module is configured by mounting a semiconductor element such as an insulated gate bipolar transistor (IGBT) or metal oxide semiconductor field effect transistor (MOSFET) on the main surface of a substrate having a conductive foil such as copper (Cu) or aluminum (Al) provided on both surfaces thereof; configuring a circuit by electrically connecting a front surface electrode of the semiconductor element to a circuit pattern formed on the conductive foil on the main surface with wire bonding and establishing a lead terminal on this circuit pattern to lead electrodes; mounting the substrate having the circuit configured thereon on a conductor base formed from copper, an aluminum silicon carbide (AlSiC) composite material, or the like and surrounding the resulting structure in a resin case; sealing the circuit by filling the case with a flexible insulating resin such as silicon gel; and tightly sealing this structure with a resin lid, as shown in Patent Documents 1 and 2, for example. Alternatively, a semiconductor module is formed by mounting a semiconductor element on the main surface of a substrate; forming a circuit by providing a circuit substrate on this structure, electrically connecting a front surface electrode of the semiconductor element and a circuit pattern formed on conductive foil on the main surface with a pin terminal inserted through the circuit substrate, and establishing a lead terminal on this circuit pattern; sealing the circuit by molding the substrate having the circuit formed thereon using a hard insulating resin such as epoxy resin, and leading an electrode by causing a tip of the lead electrode to protrude from the insulating resin; and exposing the other surface of the substrate from the insulating resin, as shown in Patent Document 3, for example.

Furthermore, it is possible to increase the capacitance (i.e. realize a large current) by forming a single semiconductor device by connecting a plurality of semiconductor modules configured in the manner described above in parallel using a busbar or the like, such as shown in Patent Document 4, for example.

Patent Document 1: Japanese Patent Application Publication No. 2015-198227
Patent Document 2: International Publication WO 2009/081723
Patent Document 3: Japanese Patent Application Publication No. 2011-77280
Patent Document 4: International Publication WO 2013/146212

However, in a semiconductor module in which the circuit is sealed using a flexible insulating substrate such as silicon gel, when the thermal resistance of the insulating resin is low or the rated voltage is high, branch-like fractures referred to as trees occur within the insulating resin due to partial discharge, and there is a possibility of the tree expanding as a result of repeated partial discharges, thereby leading to insulation breakdown. In contrast to this, in a semiconductor module in which the circuit is sealed by a hard insulating resin such as epoxy resin, even when partial discharge occurs the expansion of the tree is slow and insulation breakdown does not occur easily, but when the module is made large-scale by mounting a plurality of semiconductor elements thereon to increase the capacitance, stress occurs within the module because of the heat cycle. Furthermore, the resin mold peels away from the substrate, the lead electrode, and the like due to this stress, and there is a possibility that this will cause a drop in the insulating capability. Yet further, in a semiconductor device in which a single module is made small and a plurality of semiconductor modules are connected in parallel using a busbar or the like to increase the capacitance, particularly when the rated voltage is high, it is difficult to ensure an insulation distance (also referred to as creepage distance or clearance distance) between the terminals or between a terminal and the ground.

SUMMARY

According to a first aspect of the present invention, provided is a semiconductor device comprising a plurality of semiconductor units that each include semiconductor elements, a unit case that seals the semiconductor elements, and a first unit terminal that is exposed inside a first recessed portion provided in a top surface of the unit case; a first unit connection portion that includes, in correspondence with each of the plurality of semiconductor units, a first connection terminal connected to the first unit terminal, a first connection conductor connected between a plurality of the first connection terminals, and a first connection conductor sealing portion that seals the first connection conductor while exposing the plurality of first connection terminals; and a plurality of first recessed sealing portions that each, in correspondence with each of the plurality of semiconductor units, seal each connection portion between the first unit terminal and the first connection terminal inside a recess of the first recessed portion.

According to a second aspect of the present invention, provided is a semiconductor device manufacturing method comprising manufacturing a plurality of semiconductor units that each include semiconductor elements, a unit case that seals the semiconductor elements, and a first unit terminal that is exposed inside a first recessed portion provided in a top surface of the unit case; manufacturing a first unit connection portion that includes, in correspondence with each of the plurality of semiconductor units, a first connection terminal connected to the first unit terminal, a first connection conductor connected between a plurality of the first connection terminals, and a first connection conductor sealing portion that seals the first connection conductor while exposing the plurality of first connection terminals; for each of the plurality of semiconductor units, connecting the first unit terminal and the first connection terminal in a recess of the first recessed portion; and forming a plurality of first recessed sealing portions by, in correspondence with each of the plurality of semiconductor units, sealing each connection portion between the first unit terminal and the first connection terminal inside the recess of the first recessed portion.

The summary clause does not necessarily describe all necessary features of the embodiments of the present invention. The present invention may also be a sub-combination of the features described above.

BRIEF DESCRIPTION OF THE DRAWINGS

FIG. 8A is an overhead view of the configuration of the unit connection portion according to a modification.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In this Specification, the term "connect" is not particularly limited, and the meaning of this term includes electrical connection in a manner enabling electrical conduction.

Figure 1A:
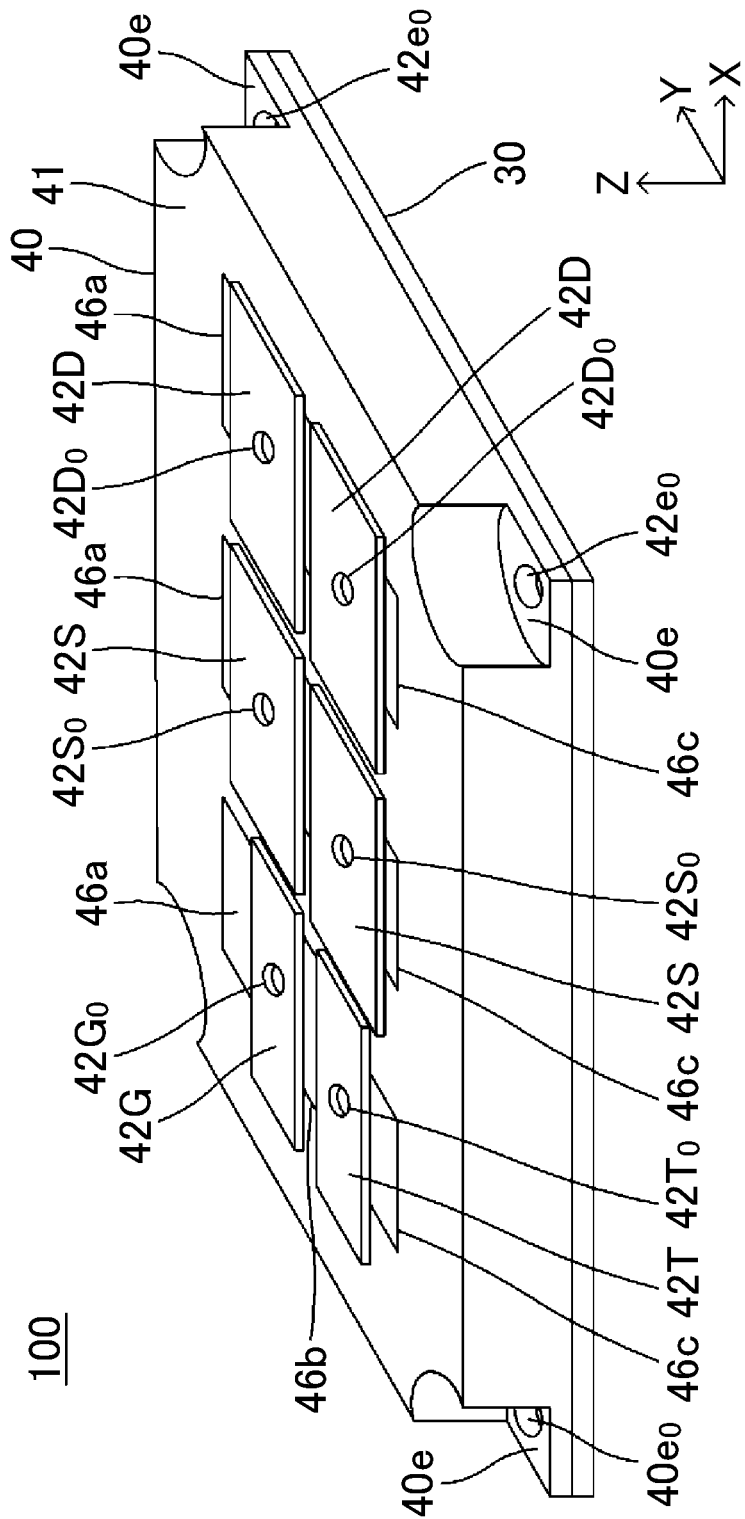
FIG. 1A shows the semiconductor device in a state where the electrode terminal of the unit connection portion is bent on the lid portion in a manufacturing step of the semiconductor device, along with the configuration of the semiconductor device according to the present embodiment.
Figure 1B:
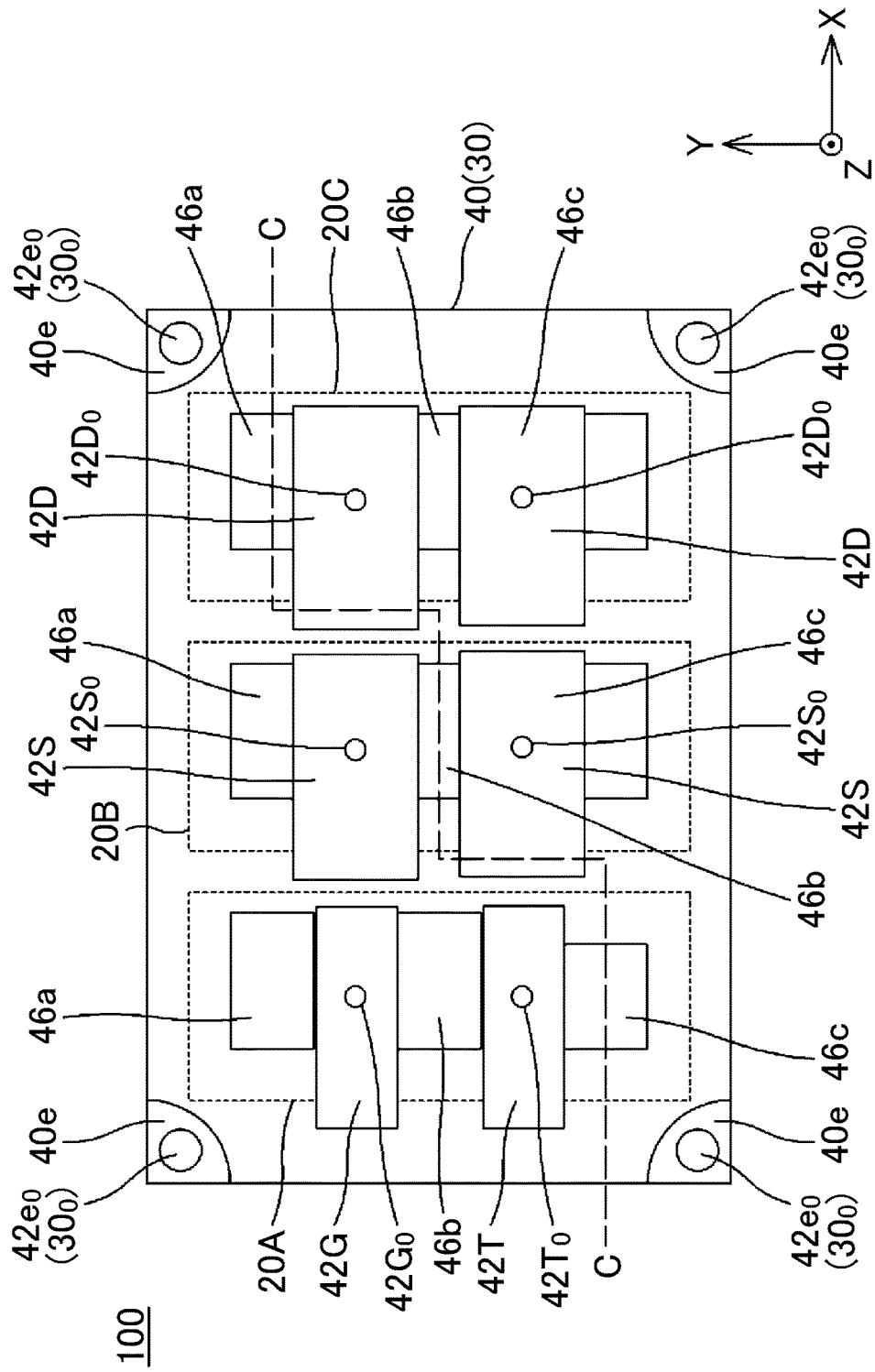
FIG. 1B shows an overhead view of the semiconductor device in a state where the electrode terminal of the unit connection portion is bent on the lid portion in a manufacturing step of the semiconductor device, along with the configuration of the semiconductor device.

FIGS. 1A and 1B show a configuration of a semiconductor device 100 according to an embodiment of the present invention. Here, FIG. 1A shows an outside configuration of the semiconductor device 100, and FIG. 1B is an overhead view of the outside configuration of the semiconductor device 100. The semiconductor device 100 is intended to provide a semiconductor device with high thermal resistance and high withstand voltage, and includes a plurality of semiconductor units 20A to 20C and a unit connection portion 40, as well as a conductor base 30, first to third recessed sealing portions 45a to 45c, and first to third lid portions 46a to 46c described further below. The outside configuration of the semiconductor device 100 is shown without considering the insulation distance between terminals in order to simplify the drawing, but the actual semiconductor device is configured in consideration of the insulation distances between terminals and between the terminals and the ground as well.

The plurality of semiconductor units 20A to 20C are switching apparatuses provided to inverters or the like, for example. In the present embodiment, three semiconductor units 20A to 20C are mounted on the semiconductor device 100 as an example, but the number of semiconductor units is not limited to three, and any number of semiconductor units greater than or equal to two may be mounted. The semiconductor units 20A to 20C all have the same configuration. Here, a description is provided using the configuration of the semiconductor unit 20A as a representative.

Figure 2A:
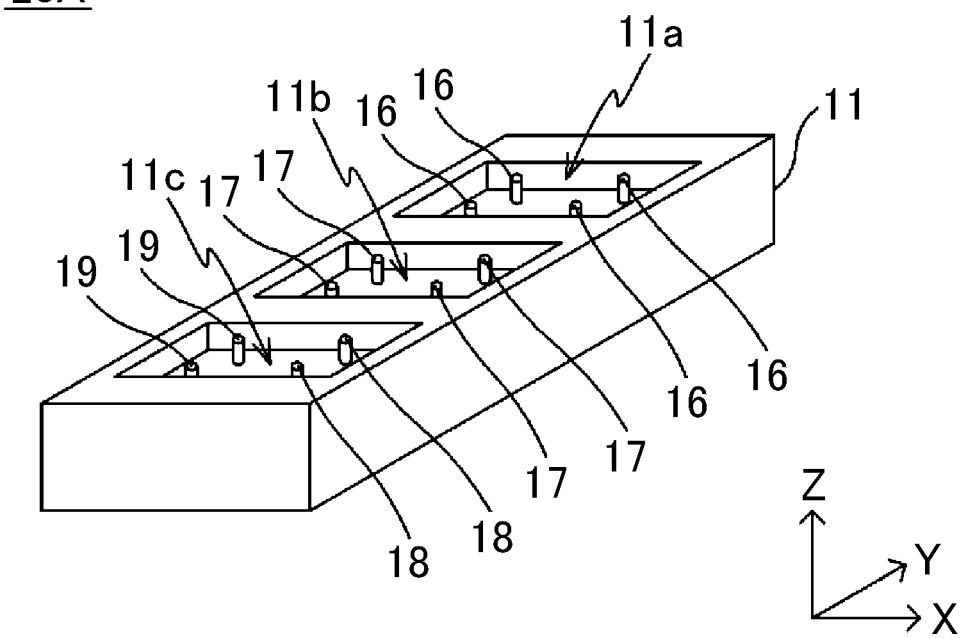
FIG. 2A shows a configuration of the semiconductor unit.
Figure 2B:
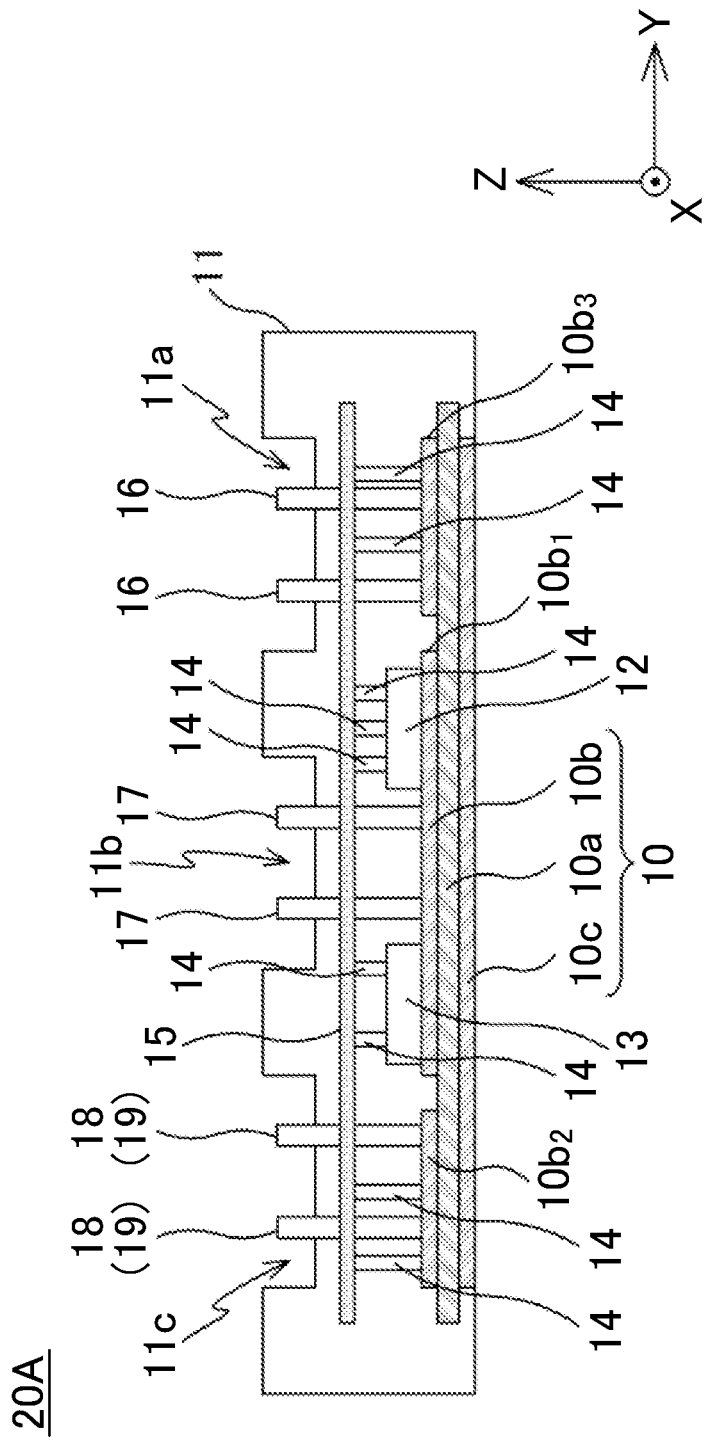
FIG. 2B shows an inside configuration of the semiconductor unit.

FIGS. 2A and 2B respectively show an outside configuration and an inside configuration of the semiconductor unit 20A. The semiconductor unit 20A includes a unit case 11, a substrate 10, semiconductor elements 12 and 13, one or more pin terminals 14, a circuit substrate 15, and first to fourth unit terminals 16 to 19.

The unit case 11 is a sealing component that seals the semiconductor elements 12 and 13 and other configurational components of the semiconductor unit 20A therein, while allowing the top ends of the first to fourth unit terminals 16 to 19 to protrude and exposing the bottom surface of the substrate 10 in the floor plane as the bottom surface of the unit case 11. The unit case 11 is formed with a rectangular shape that is long in one axial direction (i.e. the Y-axis direction), by molding using a thermosetting resin such as an epoxy resin, for example. It should be noted that first to third recessed portions 11a to 11c, which each have a rectangular cross section that is long in the X-axis direction, are arranged in the Y-axis direction in the top surface.

The substrate 10 is a plate-shaped member on which the semiconductor elements and the like are mounted, and can be a DCB (Direct Copper Bonding) substrate, AMB (Active Metal Brazing) substrate, or the like. The substrate 10 includes an insulating plate 10a and metal plates 10b and 10c. The insulating plate 10a is a plate-shaped component that is formed from an insulating ceramic such as aluminum nitride, silicon nitride, or aluminum oxide, for example. The metal plates 10b and 10c are affixed respectively to the top surface and the bottom surface of the insulating plate 10a, using conductive metal foil such as aluminum. The metal plate 10b includes circuit patterns $10b_1$ to $10b_3$ that connect to the semiconductor elements and/or the unit terminals.

The semiconductor element 12 is a switching element made from a compound semiconductor such as SiC, for example, and can be a vertical metal oxide semiconductor field effect transistor (MOSFET), insulated gate bipolar transistor (IGBT), or the like that includes electrodes on each of the front surface and the back surface. The semiconductor element 12 is not limited to being a vertical element, and may be a horizontal element in which an electrode is provided only on the front surface. If the semiconductor element 12 is a MOSFET (or IGBT), the semiconductor element 12 includes a source electrode (emitter electrode) and a gate electrode on the front surface, and a drain electrode (collector electrode) on the back surface. The semiconductor element 12 is mounted on the substrate 10 by having the back surface thereof bonded to the circuit pattern $10b_1$ using a bonding agent such as solder.

The semiconductor element 13 is a rectifying element made from a compound semiconductor such as SiC, for example, and can be a vertical Schottky barrier diode (SBD) that has electrodes on each of the front surface and the back surface, for example. The semiconductor element 13 is not limited to being a vertical element, and may be a horizontal element in which an electrode is provided only on the front surface. The semiconductor element 13 includes an anode electrode on the front surface, and a cathode electrode on the back surface. The semiconductor element 13 is mounted on the substrate 10 by having the back surface thereof bonded to the circuit pattern $10b_1$ using a bonding agent such as solder. In this way, the cathode electrode of the semiconductor element 13 is connected to the drain electrode of the semiconductor element 12.

In the semiconductor device 100 of the present embodiment, two semiconductor elements 12 and 13 are provided to the semiconductor unit 20A, but the present invention is not limited to this and it is acceptable for only the semiconductor element 12 to be provided, or for a plurality of sets each including the semiconductor elements 12 and 13 to be provided in parallel.

The one or more pin terminals 14 are conductive components provided between the semiconductor elements 12 and 13 and substrate 10 and the circuit substrate 15 described further below, to provide conduction therebetween, and are formed with pillar shapes, such as round pillars, using a conductive metal such as copper or aluminum, for example. The one or more pin terminals 14 are established on the semiconductor elements 12 and 13 and the substrate 10 by having the bottom ends thereof attached thereto using a bonding agent such as solder, and the top surfaces of the one or more pin terminals 14 are connected to the metal plate on the circuit substrate 15 by solder, brazing, or caulking.

As an example, the one or more pin terminals 14 include three pin terminals 14 corresponding to the semiconductor element 12, two pin terminals 14 corresponding to the semiconductor element 13, and sets of two pin terminals 14 corresponding respectively to the circuit patterns $10b_2$ and $10b_3$ of the substrate 10. Two of the pin terminals 14 among the three pin terminals 14 are established on a source electrode of the semiconductor element 12 or a terminal connected to the source electrode, the remaining one pin terminal 14 is established on the gate electrode of the semiconductor element 12 or a terminal connected to the gate electrode, and these pin terminals 14 are connected to the metal plate on the circuit substrate 15. Two pin terminals 14 are established on the anode electrode of the semiconductor element 13 or a terminal connected to the anode electrode, and are connected to the metal plate on the circuit substrate 15. The sets of two pin terminals 14 are established respectively on the circuit patterns $10b_2$ and $10b_3$ on the substrate 10, and are connected to the metal plate on the circuit substrate 15.

The circuit substrate 15 is a substrate that connects the electrodes of each of the semiconductor element 12 and the semiconductor element 13 to each other or to the first to fourth unit terminals 16 to 19. The circuit substrate 15 includes an insulating plate and a metal plate forming a circuit pattern on the front surface thereof. The insulating plate can be a rigid substrate formed from a glass epoxy material or the like, or a flexible substrate formed from polyimide or the like, for example. The circuit substrate 15 is provided with a plurality of holes (not shown in the drawings) through which the pin terminals 14 and the first to fourth unit terminals 16 to 19 are inserted. The metal plate is provided on the front surface of the insulating plate, using a conductive metal foil such as copper or aluminum.

The first and second unit terminals 16 and 17 are terminals for conducting current output from the semiconductor elements 12 and 13 and outputting this current to the outside of the semiconductor unit 20A. The first and second unit terminals 16 and 17 are formed as circular pillars or square pillars using a conductive metal such as copper or aluminum, for example. The first and second unit terminals 16 and 17 each include two or more terminals, in this example four terminals, that have the same potential as each other, and are established on the substrate 10 by having the bottom ends thereof bonded respectively to the circuit patterns $10b_3$ and $10b_1$ of the substrate 10 by a bonding agent such as solder or by ultrasonic bonding, and the top ends of the first and second unit terminals 16 and 17 are exposed at a position that is lower than the top surface of the semiconductor unit 20A and near the four corners within the first and second recessed portions 11a and 11b of the unit case 11 by being inserted through the holes of the circuit substrate 15. The first unit terminal 16 is connected to the source electrode of the semiconductor element 12 and the anode electrode of the semiconductor element 13 via a pin terminal 14, the circuit substrate 15, and the circuit pattern $10b_3$, and functions as a source terminal. The second unit terminal 17 is connected to the drain electrode of the semiconductor element 12 and the cathode electrode of the semiconductor element 13 via the circuit pattern $10b_1$, and functions as a drain terminal.

The third and fourth unit terminals 18 and 19 are, respectively, a terminal for outputting an output signal of the semiconductor element 12 (i.e. a source signal) to the outside of the semiconductor unit 20A and a terminal for inputting a control signal to the semiconductor element 12 from outside the semiconductor unit 20A. In a similar manner as the first and second unit terminals 16 and 17, the third and fourth unit terminals 18 and 19 are formed as circular pillars or square pillars using a conductive metal such as copper or aluminum, for example. The third and fourth unit terminals 18 and 19 each include two terminals, and are established on the substrate 10 by having the bottom ends thereof bonded respectively to the insulating plate 10$a$ and the circuit pattern 10$b_2$ of the substrate 10 by a bonding agent such as solder or by ultrasonic bonding, and the top ends of the third and fourth unit terminals 18 and 19 exposed at positions that are lower than the top surface of the semiconductor unit 20A and on the +X side and −X side inside the third recessed portion 11$c$ of the unit case 11 via the holes of the circuit substrate 15. The third unit terminal 18 is connected to the source electrode of the semiconductor element 12 via the circuit substrate 15 and a pin terminal 14, and functions as a source sensing terminal. The fourth unit terminal 19 is connected to the gate electrode of the semiconductor element 12 via the pin terminals 14, the circuit substrate 15, and the circuit pattern 10$b_2$, and functions as a gate terminal.

Figure 2C:
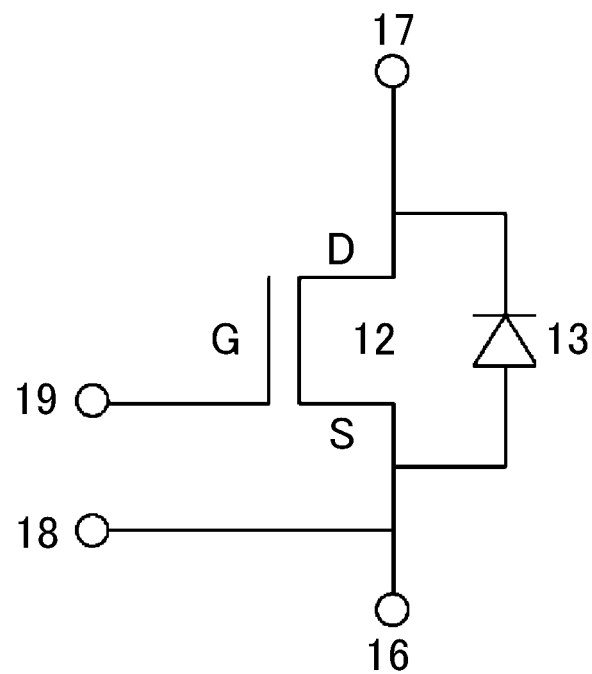
FIG. 2C shows a circuit configuration of the semiconductor unit.

FIG. 2C shows a circuit configuration of the semiconductor unit 20A. In the semiconductor unit 20A, the semiconductor elements 12 and 13 are connected between the first and second unit terminals 16 and 17 via the circuit pattern 10$b_1$, the pin terminals 14, and the circuit substrate 15, but it should be noted that the semiconductor element 13 forms a switching apparatus connected in reverse parallel with the semiconductor element 12. The semiconductor element 12 is turned ON/OFF by having a control signal (or a switching signal contained therein) input to the gate electrode thereof via the fourth unit terminal 19, and conducts or stops the current flowing through the first unit terminal 16 from the second unit terminal 17. The output signal of the semiconductor element 12 (i.e. the source signal) is output via the third unit terminal 18.

Figure 3A:
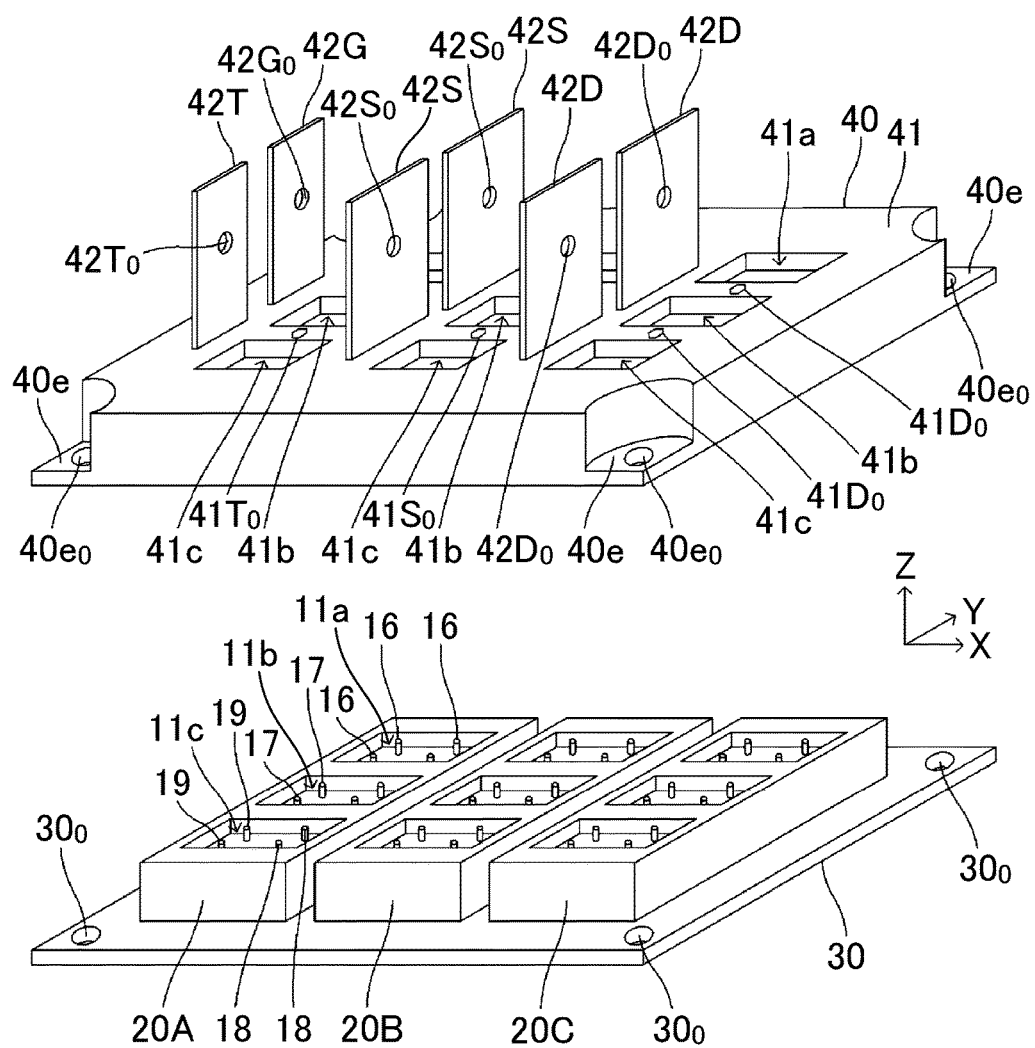
FIG. 3A shows a configuration of the conductor base with the unit connection portion and the semiconductor unit mounted thereon.
Figure 3B:
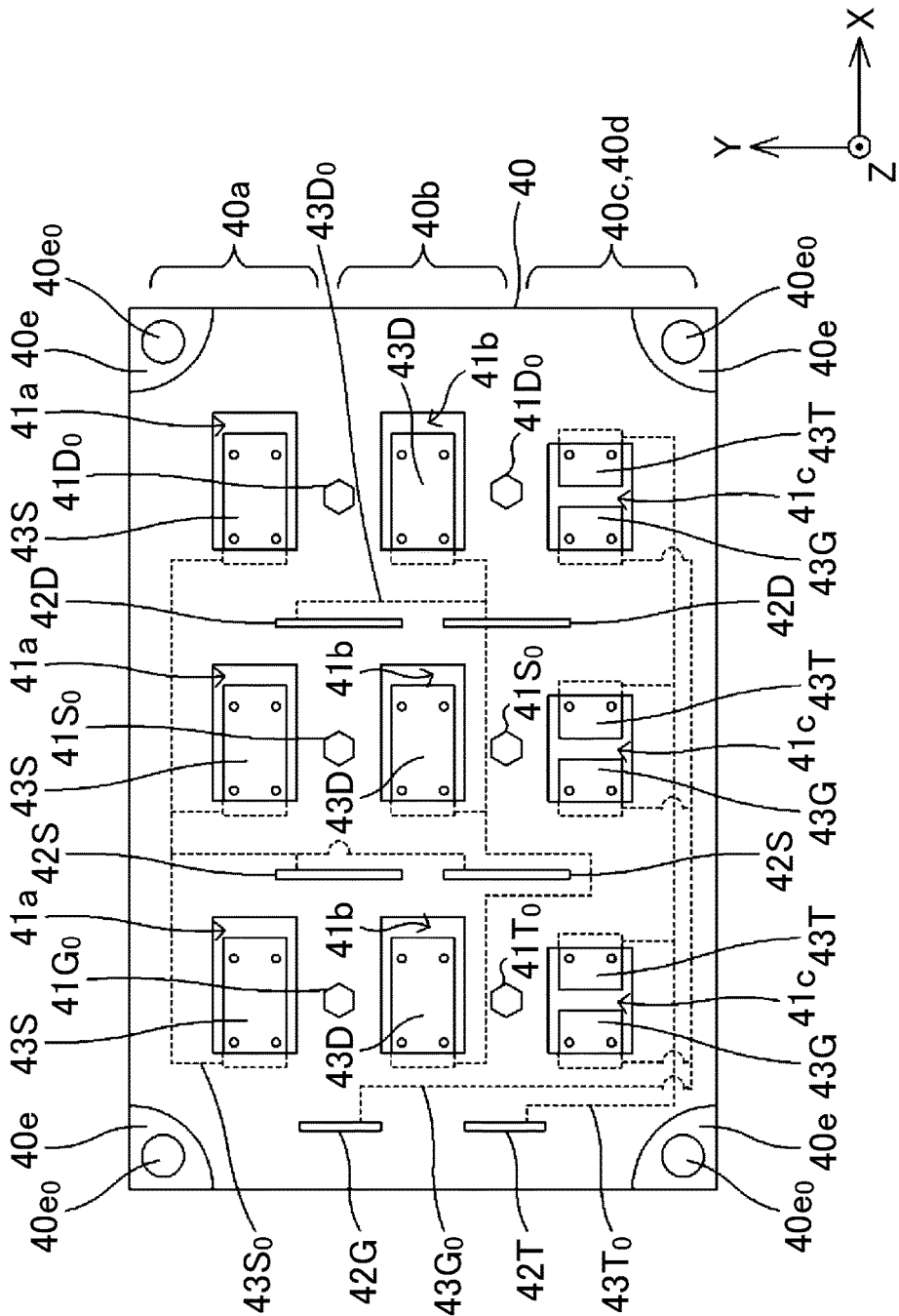
FIG. 3B is an overhead view of the configuration of the unit connection portion.
Figure 3C:
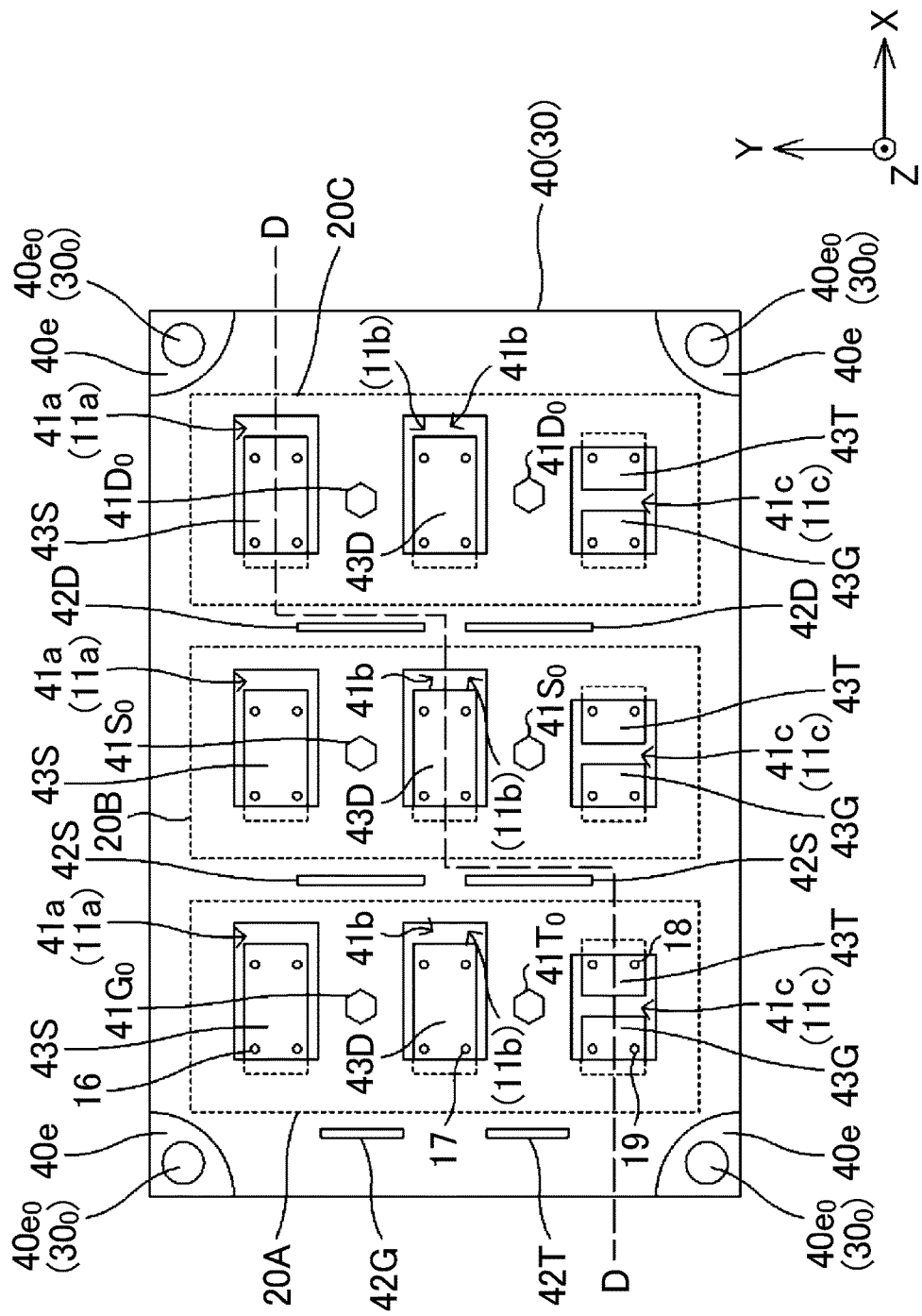
FIG. 3C is an overhead view of a state in which the unit connection portion and the conductor base with the semiconductor unit mounted thereon are overlapping.
Figure 3D:
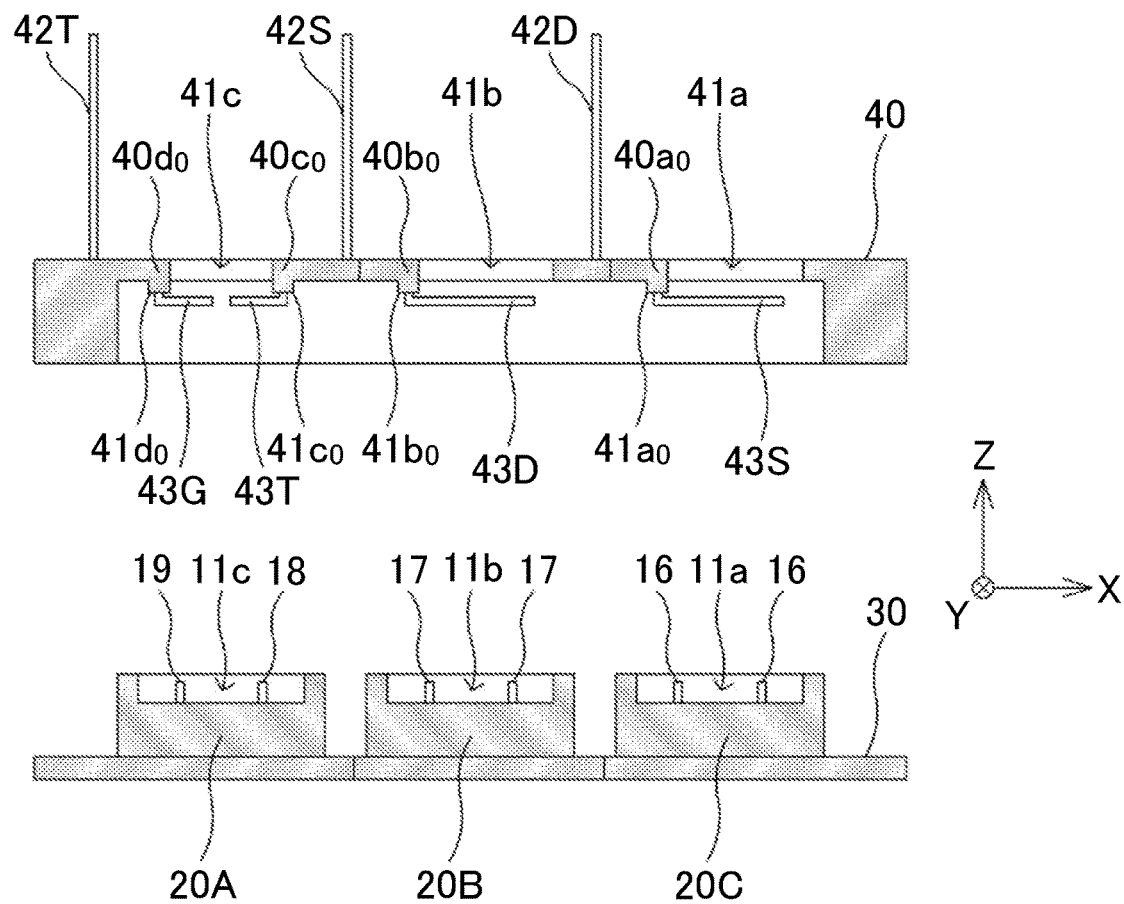
FIG. 3D shows a cross-sectional configuration over the reference line DD in FIG. 3, in a state where the unit connection portion and the conductor base with the semiconductor unit mounted thereon are overlapping.

FIGS. 3A to 3D show configurations of the unit connection portion 40 and the conductor base 30 in a state before the assembly of the semiconductor device 100. Here, FIG. 3A shows the configuration of the unit connection portion 40 and the conductor base 30 with the semiconductor units 20A to 20C mounted thereon, FIG. 3B is an overhead view of the configuration of the unit connection portion 40, FIG. 3C is an overhead view of a state in which the unit connection portion 40 and the conductor base 30 with the semiconductor units 20A to 20C mounted thereon are overlapping, and FIG. 3D shows a cross-sectional configuration over the reference line DD in FIG. 3C in a state where the unit connection portion 40 and the conductor base 30 with the semiconductor units 20A to 20C mounted thereon are overlapping.

The unit connection portion 40 is a member that connects the first to fourth unit terminals 16 to 19 of the semiconductor units 20A to 20C to each other, and includes electrode terminals 42S, 42D, 42T, and 42G and first to fourth unit connection portions 40$a$ to 40$d$. The unit connection portion 40 is formed in the shape of a case with an open floor, using a hard insulating resin such as epoxy resin, for example. Here, a stepped portion 40$e$ is formed in each of the four corner portions, and a hole 40$e_0$ is formed penetrating through the center of each stepped portion 40$e$ in the Z-axis direction. In the top surface 41, three sets that each include first to third through-holes 41$a$, 41$b$, and 41$c$ penetrating in the Z-axis direction and arranged in the X-axis direction are formed, holes 41$G_0$, 41$S_0$, and 41$D_0$ are formed respectively in the sets of three through-holes between the first and second through-holes 41$a$ and 41$b$, and holes 41$T_0$, 41$S_0$, and 41$D_0$ are formed respectively in the sets of three through-holes between the second and third through-holes 41$b$ and 41$c$.

The electrode terminal 42S is connected to the first unit terminals 16 of the semiconductor units 20A to 20C, and functions as a common source terminal. The electrode terminal 42S includes two terminals that are secured with base ends embedded in the top surface 41 and tips extending in the +Z direction on the −X side of the holes 41$S_0$, specifically at respective positions that are on the −X side and centered between the central first and second through-holes 41$a$ and 41$b$ and on the −X side and centered between the central second and third through-holes 41$b$ and 41$c$. A circular hole 42$S_0$ is formed in the center of each terminal of the electrode terminals 42S.

The electrode terminal 42D is connected to the second unit terminals 17 of the semiconductor units 20A to 20C, and functions as a common drain terminal. The electrode terminal 42D includes two terminals that are secured with base ends embedded in the top surface 41 and tips extending in the +Z direction on the −X side of the holes 41$D_0$, specifically at respective positions that are on the +X side and centered between the central first and second through-holes 41$a$ and 41$b$ and on the +X side and centered between the central second and third through-holes 41$b$ and 41$c$. A circular hole 42$D_0$ is formed in the center of each terminal of the electrode terminal 42D.

The electrode terminal 42T is connected to the third unit terminals 18 of the semiconductor units 20A to 20C, and functions as a common source sensing terminal. The electrode terminal 42T is secured on the −X side of the hole 41$T_0$, with the base end embedded in the top surface 41 and the tip extending in the +Z direction. A circular hole 42$T_0$ is formed in the center of the electrode terminal 42T.

The electrode terminal 42G is connected to the fourth unit terminals 19 of the semiconductor units 20A to 20C, and functions as a common gate terminal. The electrode terminal 42G is secured on the −X side of the hole 41$G_0$, with the base end embedded in the top surface 41 and the tip extending in the +Z direction. A circular hole 42$G_0$ is formed in the center of the electrode terminal 42G.

The holes 41$S_0$, 41$D_0$, 41$T_0$, and 41$G_0$ in the top surface 41 can be used to secure the electrodes of an external apparatus or the like implementing the semiconductor device 100 to the electrode terminals 42S, 42D, 42T, and 42G of the unit connection portion 40. The holes 41$S_0$, 41$D_0$, 41$T_0$, and 41$G_0$ each house therein a nut (not shown in the drawings) oriented in the Z-axis direction as a female screw, and the electrodes of the external apparatus or the like are secured to the electrode terminals 42S, 42D, 42T, and 42G by screwing a male screw, which is a securing jig such as a bolt (not shown in the drawings) into the female screw of the nut via the holes 42$S_0$, 42$D_0$, 42$T_0$, and 42$G_0$ of the electrode terminals 42S, 42D, 42T, and 42G bent above the nuts in addition to the electrode holes (not shown in the drawings) of the external apparatus or the like connected thereto.

In the present embodiment, the first to fourth unit connection portions 40$a$ to 40$d$ are a portion of the top surface 41 of the unit connection portion 40, the portion around the three first through-holes 41$a$ is the first unit connection portion 40$a$, the portion around the three second through-holes 41$b$ is the second unit connection portion 40$b$, and the portion around the three third through-holes 41c is the third and fourth unit connection portions 40c and 40d (see FIG. 3B).

The first unit connection portion 40a is a unit that connects the first unit terminals 16 of the semiconductor units 20A to 20C to the electrode terminal 42S, and includes the first connection terminal 43S, the first connection conductor $43S_0$, and a first connection conductor sealing portion $40a_0$.

The first connection terminal 43S is a terminal connected to the first unit terminals 16 of the semiconductor units 20A to 20C. The first connection terminal 43S includes a plurality of metal pieces (here, three metal pieces corresponding to the plurality of semiconductor units 20A to 20C) that are formed as curved L shapes in a side view and each have four holes formed therein through which the first unit terminals 16 pass, and each metal piece has the base end secured to an edge portion (i.e. the first connection conductor sealing portion $40a_0$ described further below) on the –X side of the three first through-holes 41a and the tip extending toward the edge portion on the +X side of the first through-holes 41a (see FIGS. 3C and 3D). In other words, the first connection terminal 43S includes an end portion distanced from the first connection conductor $43S_0$ and the first connection conductor sealing portion $40a_0$ described further below.

The first connection conductor $43S_0$ is a conductor that is connected between a plurality of the first connection terminals 43S and connects these first connection terminals 43S to the electrode terminal 42S. The first connection conductor $43S_0$ adopts a wire made from a conductive metal such as copper or aluminum or a conductive alloy such as an iron aluminum alloy, for example, and is embedded in the first unit connection portion 40a to connect the base end of the first connection terminal 43S to the base end of the electrode terminal 42S (see FIG. 3B). The first connection conductor $43S_0$ is not limited to being a wire, and may adopt a conductive plate formed in a plate shape using a conductive alloy or a component formed integrally to include the first connection terminal 43S, for example.

The first connection conductor sealing portion $40a_0$ seals the first connection conductor $43S_0$, and is a solid portion of the unit connection portion 40 (or the first unit connection portion 40a) that exposes a plurality of the first connection terminals 43S. The first connection conductor sealing portion $40a_0$ includes three first through-holes 41a, secures the base ends of three first connection terminals 43S to the edge portion on the –X side of each first through-hole 41a, arranges the tips of the three first connection terminals 43S at a position that is not hidden by the first connection conductor $43S_0$ and the first connection conductor sealing portion $40a_0$, i.e. a position on the –Z side of the first through-holes 41a, and seals the first connection conductor $43S_0$ therein. In this way, the tips of the first connection terminals 43S are exposed on the +Z side in a manner enabling access thereto through the first through-holes 41a (see FIGS. 3C and 3D).

The first connection conductor sealing portion $40a_0$ includes a first protruding portion $41a_0$ that protrudes in the –Z direction at the edge portion on the –X side of the first through-hole 41a and seals a portion of the first connection conductor $43S_0$ that extends toward the first connection terminal 43S (see FIG. 3D). When connected to the semiconductor units 20A to 20C using the unit connection portion 40 as described further below, the first protruding portion $41a_0$ protrudes toward the inside of the first recessed portion 11a of these units.

The second unit connection portion 40b is a unit that connects the second unit terminals 17 of the semiconductor units 20A to 20C to the electrode terminal 42D, and includes the second connection terminal 43D, the second connection conductor $43D_0$, and a second connection conductor sealing portion $40b_0$.

The second connection terminal 43D is a terminal connected to the second unit terminals 17 of the semiconductor units 20A to 20C. In a similar manner to the first connection terminal 43S described above, the second connection terminal 43D includes a plurality of metal pieces (here, three metal pieces corresponding to the plurality of semiconductor units 20A to 20C) that are formed as curved L shapes in a side view and each have four holes formed therein through which the second unit terminals 17 pass, and each metal piece has the base end secured to an edge portion (i.e. the second connection conductor sealing portion $40b_0$ described further below) on the –X side of the three second through-holes 41b and the tip extending toward the edge portion on the +X side of the second through-holes 41b (see FIGS. 3C and 3D).

The second connection conductor $43D_0$ is a conductor that is connected between a plurality of the second connection terminals 43D and connects these second connection terminals 43D to the electrode terminal 42D. The second connection conductor $43D_0$ adopts a wire similar to that of the first connection conductor $43S_0$, and is embedded in the second unit connection portion 40b to connect the base end of the second connection terminal 43D to the base end of the electrode terminal 42D (see FIG. 3B). Here, the second connection conductor $43D_0$ is arranged such that a portion thereof overlaps with the first connection conductor $43S_0$ in an overhead view, inside the first and second connection conductor sealing portions $40a_0$ and $40b_0$ formed integrally in a partially overlapping manner as described further below (i.e. inside the top surface 41 of the unit connection portion 40).

The second connection conductor sealing portion $40b_0$ seals the second connection conductor $43D_0$, is a solid portion of the unit connection portion 40 (or the second unit connection portion 40b) that exposes a plurality of the second connection terminals 43D, and a portion thereof is formed integrally overlapping with the first connection conductor sealing portion $40a_0$ in the present embodiment. The second connection conductor sealing portion $40b_0$ includes three second through-holes 41b, secures the base ends of three second connection terminals 43D to the edge portion on the –X side of each second through-hole 41b, arranges the tips of the three second connection terminals 43D on the –Z side of the second through-holes 41b, and seals the second connection conductor $43D_0$ therein. In this way, the tips of the second connection terminals 43D are exposed on the +Z side in a manner enabling access thereto through the second through-holes 41b (see FIGS. 3C and 3D).

In a similar manner as the first connection conductor sealing portion $40a_0$, the second connection conductor sealing portion $40b_0$ includes a second protruding portion $41b_0$ that protrudes in the –Z direction at the edge portion on the –X side of the second through-hole 41b and seals a portion of the second connection conductor $43D_0$ that extends toward the second connection terminal 43D (see FIG. 3D). When connected to the semiconductor units 20A to 20C using the unit connection portion 40 as described further below, the second protruding portion $41b_0$ protrudes toward the inside of the second recessed portion 11b of these units.

The third unit connection portion 40c is a unit that connects the third unit terminals 18 of the semiconductor units 20A to 20C to the electrode terminal 42T, and includes the third connection terminal 43T, the third connection conductor 43T$_0$, and a third connection conductor sealing portion 40c$_0$.

The third connection terminal 43T is a terminal connected to the third unit terminals 18 of the semiconductor units 20A to 20C. The third connection terminal 43T includes a plurality of metal pieces (here, three metal pieces corresponding to the plurality of semiconductor units 20A to 20C) that are formed as curved L shapes in a side view and each have two holes formed therein through which the third unit terminals 18 pass, and each metal piece has the base end secured to an edge portion (i.e. the third connection conductor sealing portion 40c$_0$ described further below) on the +X side of the three third through-holes 41c and the tip extending toward the edge portion on the −X side of the third through-holes 41c (see FIGS. 3C and 3D). It should be noted that the length of the tip of the third connection terminal 43T is approximately half of the length of the tips of the first and second connection terminals 43S and 43D.

The third connection conductor 43T$_0$ is a conductor that is connected between a plurality of the third connection terminals 43T and connects these third connection terminals 43T to the electrode terminal 42T. The third connection conductor 43T$_0$ adopts a wire similar to that of the first connection conductor 43S$_0$, and is embedded in the third unit connection portion 40c to connect the base end of the third connection terminal 43T to the base end of the electrode terminal 42T (see FIG. 3B).

The third connection conductor sealing portion 40c$_0$ seals the third connection conductor 43T$_0$, and is a solid portion of the unit connection portion 40 (or the third unit connection portion 40c) that exposes a plurality of the third connection terminals 43T. In a similar manner as the first and second connection conductor sealing portions 40a$_0$ and 40b$_0$, the third connection conductor sealing portion 40c$_0$ includes three third through-holes 41c, secures the base ends of three third connection terminals 43T to the edge portion on the +X side of each third through-hole 41c, arranges the tips of the three third connection terminals 43T on the −Z side of the third through-holes 41c, and seals the third connection conductor 43T$_0$ therein. In this way, the tips of the third connection terminals 43T are exposed on the +Z side in a manner enabling access thereto through the third through-holes 41c (see FIGS. 3C and 3D).

In a similar manner as the first and second connection conductor sealing portions 40a$_0$ and 40b$_0$, the third connection conductor sealing portion 40c$_0$ includes a third protruding portion 41c$_0$ that protrudes in the −Z direction at the edge portion on the +X side of the third through-hole 41c and seals a portion of the third connection conductor 43T$_0$ that extends toward the third connection terminal 43T (see FIG. 3D). When connected to the semiconductor units 20A to 20C using the unit connection portion 40 as described further below, the third protruding portion 41c$_0$ protrudes toward the inside of the third recessed portion 11c of these units.

The fourth unit connection portion 40d is a unit that connects the fourth unit terminals 19 of the semiconductor units 20A to 20C to the electrode terminal 42G, and includes the fourth connection terminal 43G, the fourth connection conductor 43G$_0$, and a fourth connection conductor sealing portion 40d$_0$.

The fourth connection terminal 43G is a terminal connected to the fourth unit terminals 19 of the semiconductor units 20A to 20C. The fourth connection terminal 43G includes a plurality of metal pieces (here, three metal pieces corresponding to the plurality of semiconductor units 20A to 20C) that are formed as curved L shapes in a side view and each have two holes formed therein through which the fourth unit terminals 19 pass, and each metal piece has the base end secured to an edge portion on the −X side of the three third through-holes 41c and the tip extending toward the edge portion on the +X side of the third through-holes 41c (see FIGS. 3C and 3D). It should be noted that the length of the tip of the fourth connection terminal 43G is approximately half of the length of the tips of the first and second connection terminals 43S and 43D.

The fourth connection conductor 43G$_0$ is a conductor that is connected between a plurality of the fourth connection terminals 43G and connects these fourth connection terminals 43G to the electrode terminal 42G. The fourth connection conductor 43G$_0$ adopts a wire similar to that of the first connection conductor 43S$_0$, and is embedded in the fourth unit connection portion 40d to connect the base end of the fourth connection terminal 43G to the base end of the electrode terminal 42G (see FIG. 3B). Here, the fourth connection conductor 43G$_0$ is arranged such that a portion thereof overlaps with the third connection conductor 43T$_0$ in an overhead view, inside the third and fourth connection conductor sealing portions 40c$_0$ and 40d$_0$ formed integrally in a partially overlapping manner as described further below (i.e. inside the top surface 41 of the unit connection portion 40).

The fourth connection conductor sealing portion 40d$_0$ seals the fourth connection conductor 43G$_0$, is a solid portion of the unit connection portion 40 (or the fourth unit connection portion 40d) that exposes a plurality of the fourth connection terminals 43G, and a portion thereof is formed integrally overlapping with the third connection conductor sealing portion 40c$_0$ in the present embodiment. In a similar manner as the third connection conductor sealing portion 40c$_0$, the fourth connection conductor sealing portion 40d$_0$ includes three third through-holes 41c, secures the base ends of three fourth connection terminals 43G to the edge portion on the −X side of each third through-hole 41c, arranges the tips of the three fourth connection terminals 43G on the −Z side of the third through-holes 41c, and seals the fourth connection conductor 43G$_0$ therein. In this way, the tips of the fourth connection terminals 43G are exposed on the +Z side in a manner enabling access thereto through the third through-holes 41c (see FIGS. 3C and 3D).

In a similar manner as the first to third connection conductor sealing portions 40a$_0$ to 40c$_0$, the fourth connection conductor sealing portion 40d$_0$ includes a fourth protruding portion 41d$_0$ that protrudes in the −Z direction at the edge portion on the −X side of the third through-hole 41c and seals a portion of the fourth connection conductor 43G$_0$ that extends toward the fourth connection terminal 43G (see FIG. 3D). When connected to the semiconductor units 20A to 20C using the unit connection portion 40 as described further below, the fourth protruding portion 41b$_0$ protrudes toward the inside of the third recessed portion 11c of these units.

In the semiconductor device 100 of the present embodiment, the first to fourth connection conductor sealing portions 40a$_0$ to 40d$_0$ are formed integrally as a portion of the unit connection portion 40, but at least two of these connection conductor sealing portions may be formed integrally such that at least portions thereof overlap, such as in the case of the first and second connection conductor sealing portions 40a$_0$ and 40b$_0$ and the case of the third and fourth connection conductor sealing portions 40c$_0$ and 40d$_0$.

At least two connection conductors corresponding to at least two connection conductor sealing portions that are formed integrally with portions thereof overlapping among the first to fourth connection conductors $43S_0$, $43D_0$, $43T_0$, and $43G_0$ are arranged such that at least portions thereof overlap inside the connection conductor sealing portions formed integrally (i.e. inside the top surface 41 of the unit connection portion 40). At this time, the third and fourth connection conductors $43T_0$ and $43G_0$, the first connection conductor $43S_0$, and the second connection conductor $43D_0$ may overlap in the stated order from the −Z side to the +Z side.

The conductor base 30 is a member that supports the semiconductor units 20A to 20C. The semiconductor units 20A to 20C each have a length oriented in the Y-axis direction and are arranged in parallel at distances from each other in the X-axis direction, and in each semiconductor unit a metal plate 10c is affixed to the bottom surface of the substrate 10 on the conductor base 30, and this substrate 10 contacts the top surface of the conductor base 30.

The conductor base 30 is formed with a rectangular plate shape from a metal material such as copper, for example. Here, a hole $30_0$ penetrating in the Z-axis direction is formed in each of the four corner portions. When the semiconductor units 20A to 20C supported on the conductor base 30 are connected using the unit connection portion 40 as described further below, the holes $30_0$ of the conductor base 30 and the holes $40e_0$ of the unit connection portion 40 are in communication. Therefore, by inserting a securing jig such as a bolt from the +Z side through these holes $40e_0$ and $30_0$, it is possible to secure the semiconductor device 100 to the external apparatus or the like and to release the heat generated inside the semiconductor units 20A to 20C into a heat sink via the conductor base 30.

The semiconductor device 100 manufacturing method is described using FIGS. 4A to 7, while also referencing FIGS. 2A to 3D.

In the first stage, the semiconductor units 20A to 20C including the semiconductor elements 12 and 13, the unit cases 11 sealing these elements, and the first to fourth unit terminals 16 to 19 exposed inside the first to third recessed portions 11a to 11c provided in the top surfaces of the unit cases 11 are manufactured (see FIGS. 2A and 2B).

First, as an example, solder in a paste state is applied to the main surface of the substrate 10 using a dispenser or the like and the semiconductor elements 12 and 13 are then mounted on this main surface, more solder in a paste state is applied on the front surface electrodes of the semiconductor elements 12 and 13 and the circuit patterns $10b_1$ to $10b_3$ of the substrate 10 and the circuit substrate 15 is supported thereon using a fixing jig, the pin terminals 14 inserted through the holes of the circuit substrate 15 are connected to the front surface electrodes of the semiconductor elements 12 and 13 and the circuit patterns $10b_2$ and $10b_3$, and the first to fourth unit terminals 16 to 19 are established on the circuit patterns $10b_1$ to $10b_3$.

Next, heating is performed using reflow or the like, and the substrate 10, the semiconductor elements 12 and 13, the pin terminals 14, and the first to fourth unit terminals 16 to 19 are solder bonded, thereby forming the circuit on the substrate 10.

Finally, the unit case 11 is formed by molding and sealing the substrate 10 on which the circuit is formed using an insulating resin. Here, the first to third recessed portions 11a to 11c are formed in the top surface of the unit case 11, the tip of the first unit terminal 16 within the first recessed portion 11a (i.e. the four terminals having the same potential included in the first unit terminal 16) protrudes, the tip of the second unit terminal 17 within the second recessed portion 11b (i.e. the four terminals having the same potential included in the second unit terminal 17) protrudes, and the tips of the third and fourth unit terminals 18 and 19 within the third recessed portion 11c (i.e. each set of two terminals included respectively in the third and fourth unit terminals 18 and 19) protrude to lead out each electrode, and the other surface of the substrate 10 is exposed in the floor surface of the unit case 11.

In the second stage, the unit connection portion 40 (the first to fourth unit connection portions 40a to 40d) including the first to fourth connection terminals 43S, 43D, 43T, and 43G connected respectively to the first to fourth unit terminals 16 to 19 corresponding to each of the semiconductor units 20A to 20C, the first to fourth connection conductors $43S_0$, $43D_0$, $43T_0$, and $43G_0$ respectively connected between the first to fourth connection terminals 43S, 43D, 43T, and 43G, and the first to fourth connection conductor sealing portions $40a_0$ to $40d_0$ that seal each of the first to fourth connection conductors $43S_0$, $43D_0$, $43T_0$, and $43G_0$ and expose the first to fourth connection terminals 43S, 43D, 43T, and 43G is manufactured (see FIGS. 3A and 3B).

First, the electrode terminals 42S, 42D, 42T, and 42G and the first to fourth connection terminals 43S, 43D, 43T, and 43G are supported using jigs. Here, three first connection terminals 43S are arranged in the X-axis direction, three second connection terminals 43D are arranged on the −Y side of the first connection terminals 43S, and three each of the third and fourth connection terminals 43T and 43G are arranged on the −Y side of the second connection terminals 43D. Furthermore, one electrode terminals 42S is arranged at each of a position centered between the first and second connection terminals 43S and 43D in the center and on the −X side and a position centered between the second and third connection terminals 43D and 43T on the −X side and the second and fourth connection terminals 43D and 43G in the center, one electrode terminal 42D is arranged at each of a position centered between the first and second connection terminals 43S and 43D in the center and on the +X side and a position centered between the second and third connection terminals 43D and 43T in the center and the second and fourth connection terminals 43D and 43G on the +X side, one electrode terminal 42T is arranged at a position on the −X side of the center between the second and fourth connection terminals 43D and 43G on the −X side, and one electrode terminal 42G is arranged at a position on the −X side of the center between the first and second connection terminals 43S and 43D on the −X side.

Next, the electrode terminals 42S, 42D, 42T, and 42G and the first to fourth connection terminals 43S, 43D, 43T, and 43G are connected using the first to fourth connection conductors $43S_0$, $43D_0$, $43T_0$, and $43G_0$. At this time, the third and fourth connection conductors $43T_0$ and $43G_0$, the first connection conductor $43S_0$, and the second connection conductor $43D_0$ are overlapping and distanced from each other in the Z-axis direction, in the stated order from the −Z side to the +Z side. In this way, without contacting each other, the first to fourth connection conductors $43S_0$, $43D_0$, $43T_0$, and $43G_0$ connect the plurality of first to fourth connection terminals 43S, 43D, 43T, and 43G to each other and also to the electrode terminals 42S, 42D, 42T, and 42G.

Finally, the base ends of the electrode terminals 42S, 42D, 42T, and 42G, the base ends of the first to fourth connection terminals 43S, 43D, 43T, and 43G, and the entirety of the first to fourth connection conductors $43S_0$, $43D_0$, $43T_0$, and $43G_0$ are sealed by a hard insulating resin such as epoxy resin, and a case shape in formed in which the floor is opened and nine through-holes 41a to 41c and six holes $41S_0$, $41D_0$, $41T_0$, and $41G_0$ are provided in the top surface.

Here, a first through-hole 41a is positioned directly above (i.e. on the +Z side of) each of the three first connection terminals 43S, a second through-hole 41b is positioned on the +Z side of each of the three second connection terminals 43D, and a third through-hole 41c is positioned on the +Z side of each of the three sets of the third and fourth connection terminals 43T and 43G (see FIG. 3D).

In the third step, in the recesses of the first to third recessed portions 11a to 11c of the semiconductor units 20A to 20C, the first to fourth unit terminals 16 to 19 and the first to fourth connection terminals 43S, 43D, 43T, and 43G are respectively connected.

First, as shown in FIGS. 3A, 3C, and 3D, the semiconductor units 20A to 20C are mounted on the conductor base 30. Here, the semiconductor units 20A to 20C are each oriented with their length in the Y-axis direction and are arranged in parallel with distance between each other in the X-axis direction on the conductor base 30.

Next, the unit connection portion 40 is overlapped onto the conductor base 30 on which the semiconductor units 20A and 20C are mounted. In this way, as understood from FIGS. 3A, 3C, and 3D, the first connection terminals 43S are positionally fixed directly above the first recessed portions 11a of the semiconductor units 20A to 20C, the second connection terminals 43D are positionally fixed directly above the second recessed portions 11b, and the third and fourth connection terminals 43T and 43G are positionally fixed directly above the third recessed portions 11c.

Figure 4A:
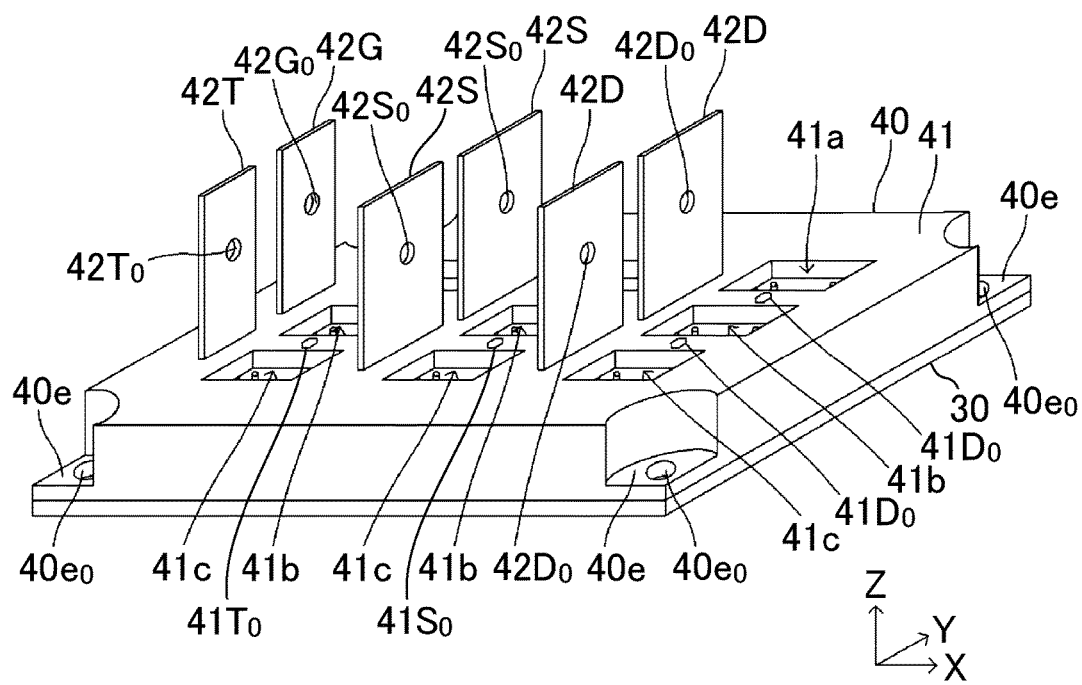
FIG. 4A shows the semiconductor device in a state where the unit connection portion is mounted on the conductor base that supports the semiconductor unit, in a manufacturing step of the semiconductor device.
Figure 4B:
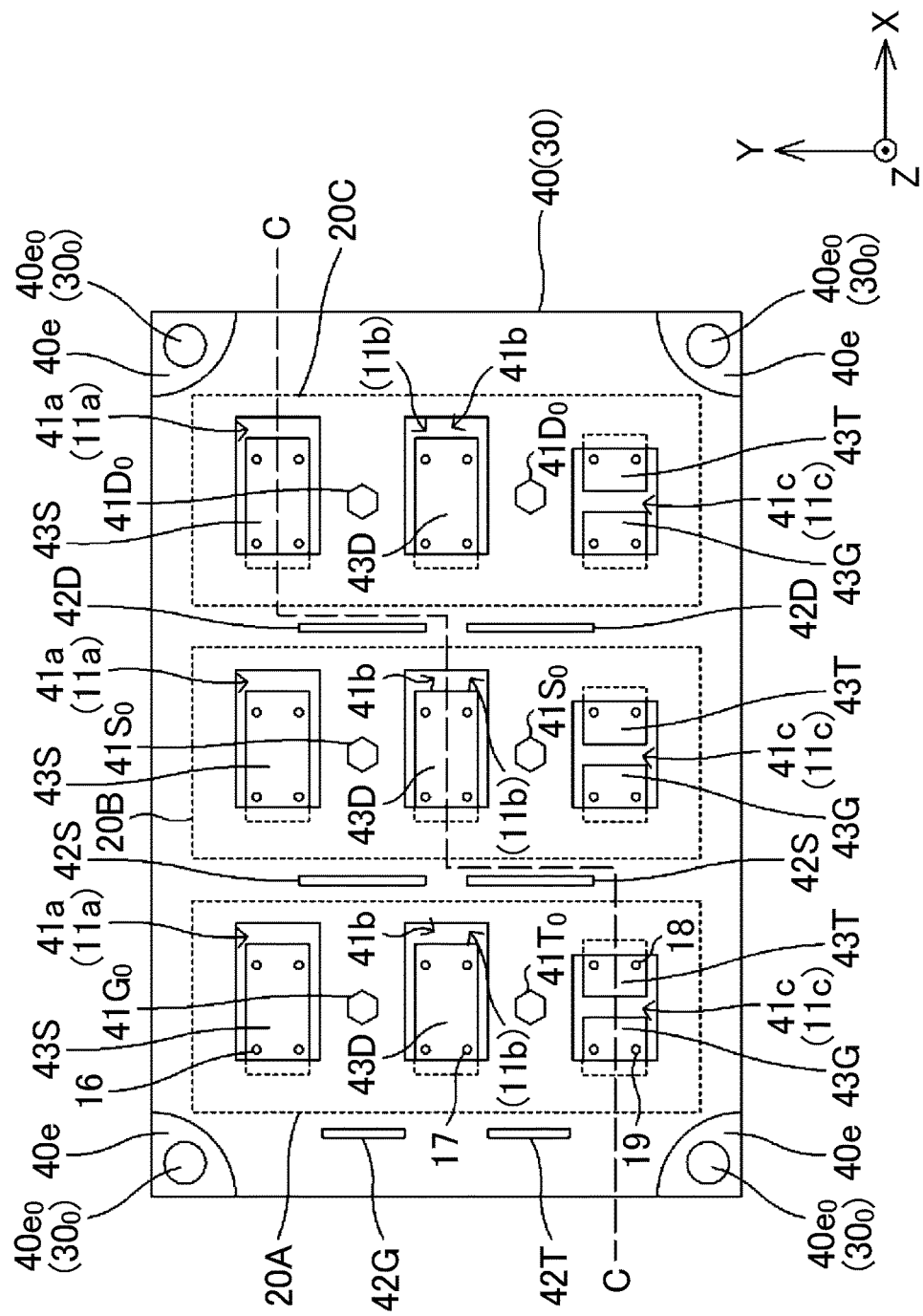
FIG. 4B is an overhead view of the semiconductor device in a state where the unit connection portion is mounted on the conductor base that supports the semiconductor unit.
Figure 4C:
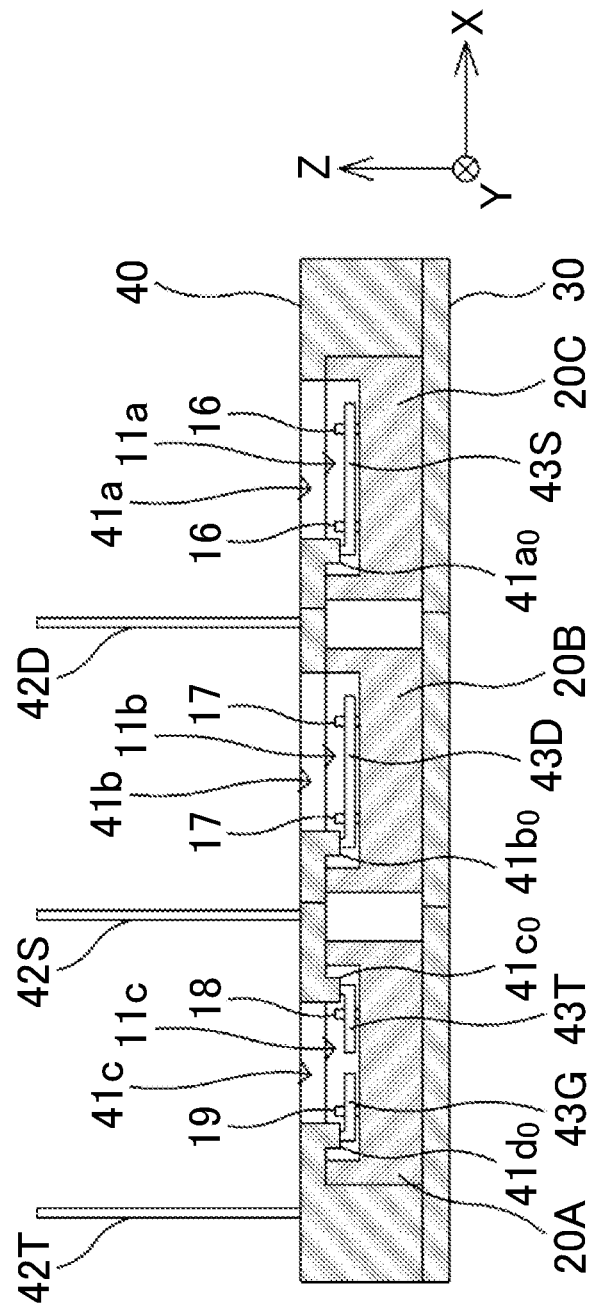
FIG. 4C shows a cross-sectional configuration of the semiconductor device over the reference line CC in FIG. 4B, in a state where the unit connection portion is mounted on the conductor base that supports the semiconductor unit.

Finally, as shown in FIGS. 4A, 4B, and 4C, the unit connection portion 40 is mounted on the conductor base 30 to house the semiconductor units 20A to 20C. At this time, the three first connection terminals 43S of the unit connection portion 40 (the first unit connection portion 40a) are inserted into the respective first recessed portions 11a of the semiconductor units 20A to 20C, and the four first unit terminals 16 protruding into these first recessed portions 11a are inserted respectively through the four holes of each first connection terminal 43S. Then, the first connection terminals 43S are connected to the first unit terminals 16 via the first through-holes 41a by performing a connection process using laser fusion, solder bonding, or the like. In this way, the electrode terminal 42S is connected to the respective first unit terminals 16 of the semiconductor units 20a to 20C via the first connection terminals 43S and the first connection conductors $43S_0$, to function as a common source terminal.

Similarly, the three second connection terminals 43D of the unit connection portion 40 (the second unit connection portion 40b) are inserted into the respective second recessed portions 11b of the semiconductor units 20A to 20C, and the four second unit terminals 17 protruding into these second recessed portions 11b are inserted respectively through the four holes of each second connection terminal 43D. Then, the second connection terminals 43D are connected to the second unit terminals 17 via the second through-holes 41b by performing a connection process. In this way, the electrode terminal 42D is connected to the respective second unit terminals 17 of the semiconductor units 20a to 20C via the second connection terminals 43D and the second connection conductors $43D_0$, to function as a common drain terminal.

Furthermore, the three sets of the third and fourth connection terminals 43T and 43G of the unit connection portion 40 (third and fourth unit connection portions 40c and 40d) are inserted into the respective third recessed portions 11c of the semiconductor units 20A to 20C, and each of the two sets of the third and fourth unit terminals 18 and 19 protruding into these third recessed portions 11c are inserted respectively through the sets of two holes of the third and fourth connection terminals 43T and 43G. Then, the third and fourth connection terminals 43T and 43G are connected to the third and fourth unit terminals 18 and 19 via the third through-holes 41c by performing a connection process. In this way, the electrode terminal 42T is connected to the respective third unit terminals 18 of the semiconductor units 20a to 20C via the third connection terminal 43T and the third connection conductor $43T_0$ to function as a common source sensing terminal, and the electrode terminal 42G is connected to the respective fourth unit terminals 19 of the semiconductor units 20a to 20C via the fourth connection terminal 43G and the fourth connection conductor $43G_0$ to function as a common gate terminal.

Figure 5A:
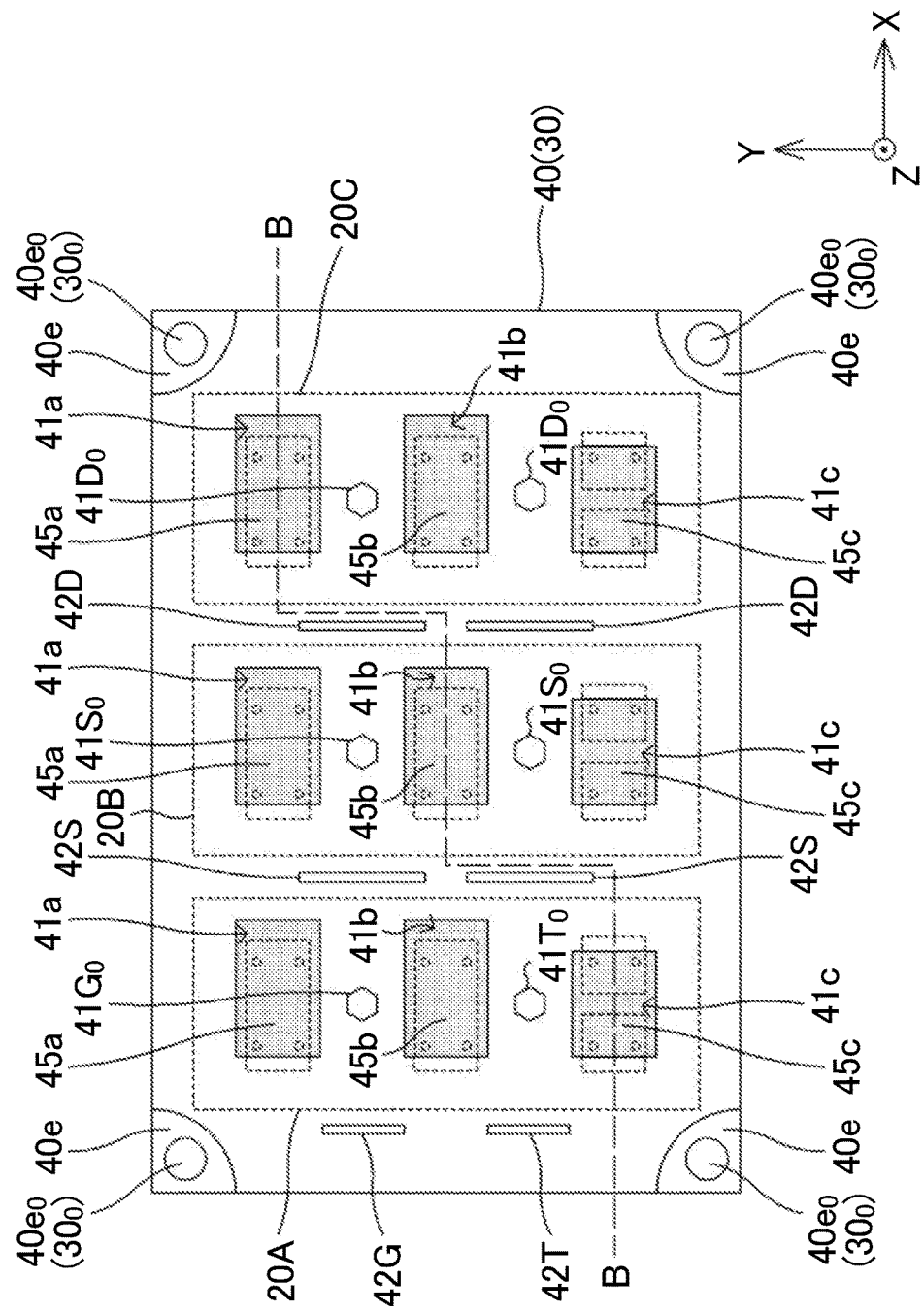
FIG. 5A is an overhead view of the semiconductor device in a state where the recessed portion of the semiconductor unit is sealed, in a manufacturing step of the semiconductor device.
Figure 5B:
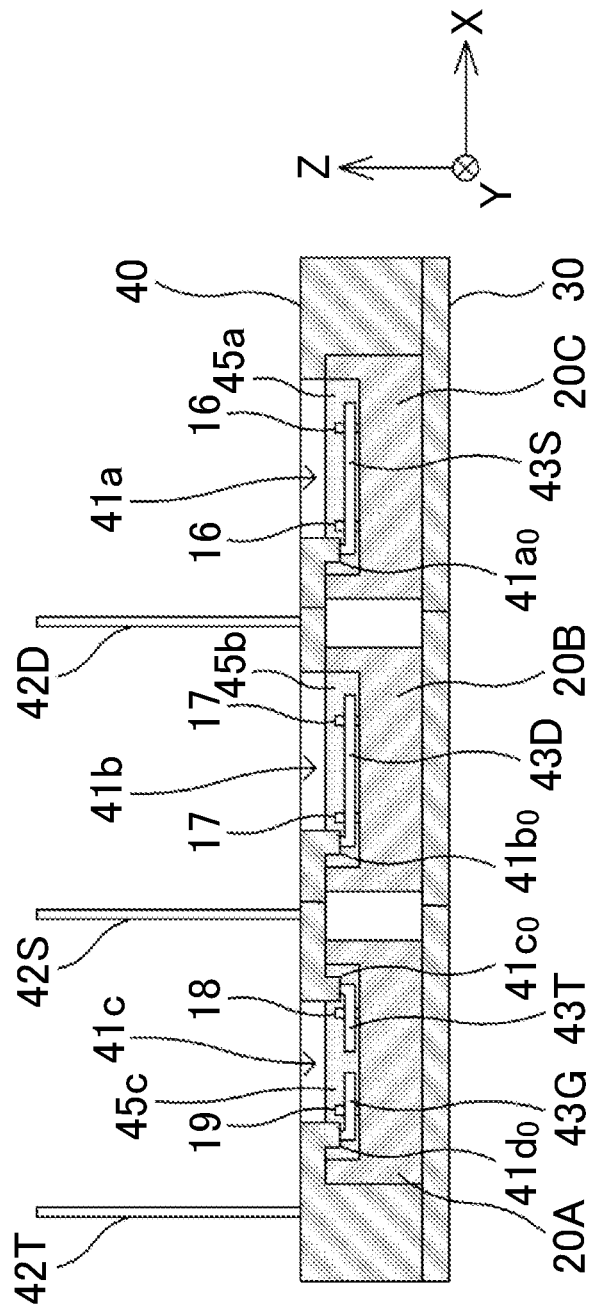
FIG. 5B shows a cross-sectional configuration of the semiconductor device over the reference line BB in FIG. 5A, in a state where the recessed portion of the semiconductor unit is sealed.

In the fourth step, as shown in FIGS. 5A and 5B, the first to third recessed sealing portions 45a to 45c are formed by sealing each of the connection portions between the first to fourth unit terminals 16 to 19 and the first to fourth connection terminals 43S, 43D, 43T, and 43G, in each recess of the first to third recessed portions 11a to 11c of the semiconductor units 20A to 20C.

The inside of the first recessed portion 11a in each of the semiconductor units 20A to 20C positioned directly below the three first through-holes 41a of the unit connection portion 40 is filled with thermosetting resin such as epoxy resin, for example, via these through-holes 41a. In this way, portions reaching to the first protruding portions $41a_0$ from the first connection terminals 43S are included inside the recesses of the first recessed portions 11a of the semiconductor units 20A to 20C, and the first recessed sealing portions 45a are formed that seal the connection portions between the first unit terminals 16 and the first connection terminals 43S.

Similarly, the inside of the second recessed portion 11b in each of the semiconductor units 20A to 20C positioned directly below the three second through-holes 41b of the unit connection portion 40 is filled with thermosetting resin such as epoxy resin, for example, via these through-holes 41b. In this way, portions reaching to the second protruding portions $41b_0$ from the second connection terminals 43D are included inside the recesses of the second recessed portions 11b of the semiconductor units 20A to 20C, and the second recessed sealing portions 45b are formed that seal the connection portions between the second unit terminals 17 and the second connection terminals 43D.

Furthermore, the inside of the third recessed portion 11c in each of the semiconductor units 20A to 20C positioned directly below the three third through-holes 41c of the unit connection portion 40 is filled with thermosetting resin such as epoxy resin, for example, via these through-holes 41c. In this way, portions reaching to the third protruding portions $41c_0$ from the third connection terminals 43T and portions reaching to the fourth protruding portions $41d_0$ from the fourth connection terminals 43G are included inside the recesses of the third recessed portions 11c of the semiconductor units 20A to 20C, and the third recessed sealing portions 45c are formed that seal the connection portions between the third unit terminals 18 and the third connection terminals 43T and seal the connection portions between the fourth unit terminals 19 and the fourth connection terminals 43G.

Figure 6A:
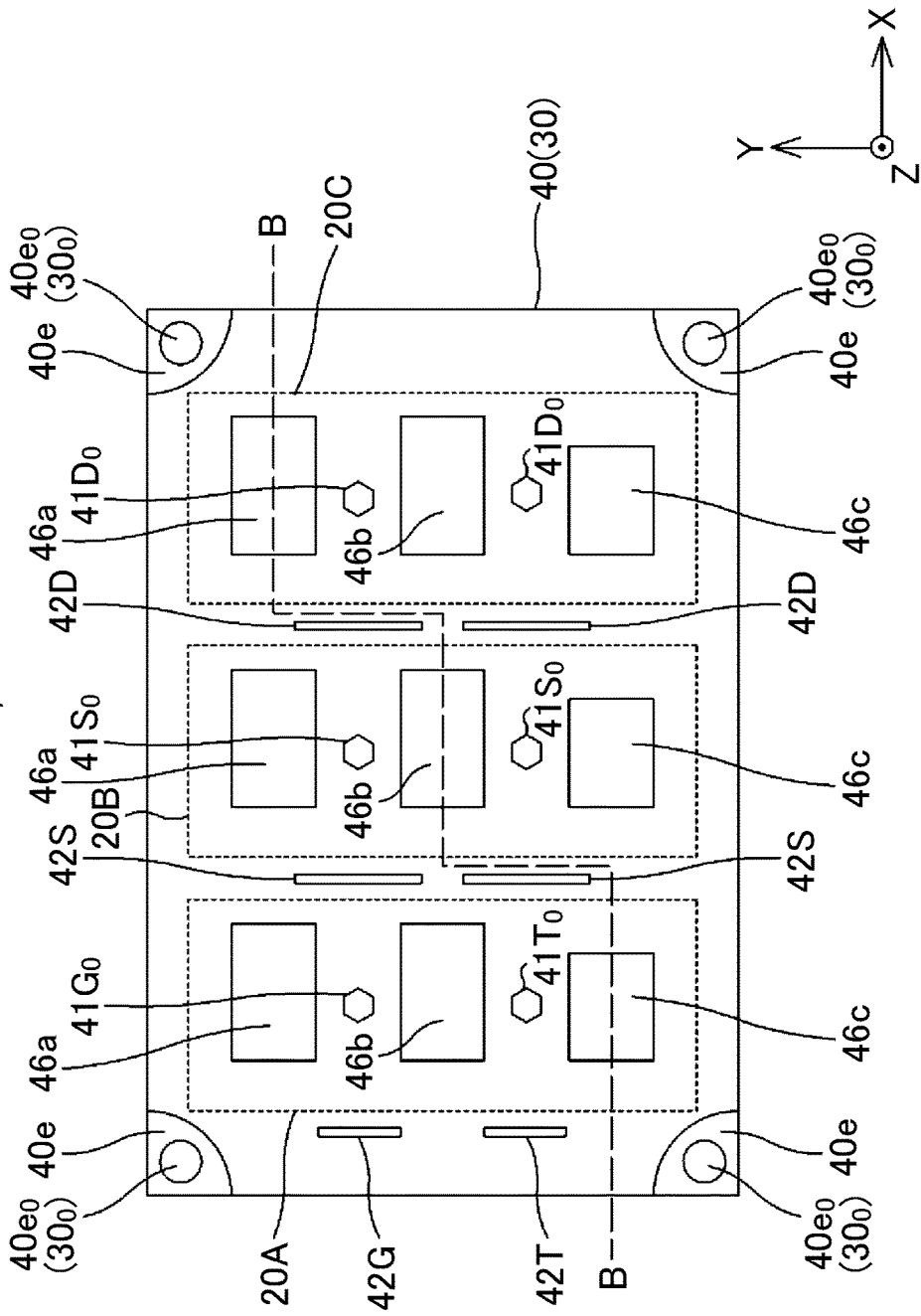
FIG. 6A is an overhead view of the semiconductor device in a state where the lid portion is provided to the through-hole of the unit connection portion, in a manufacturing step of the semiconductor device.
Figure 6B:
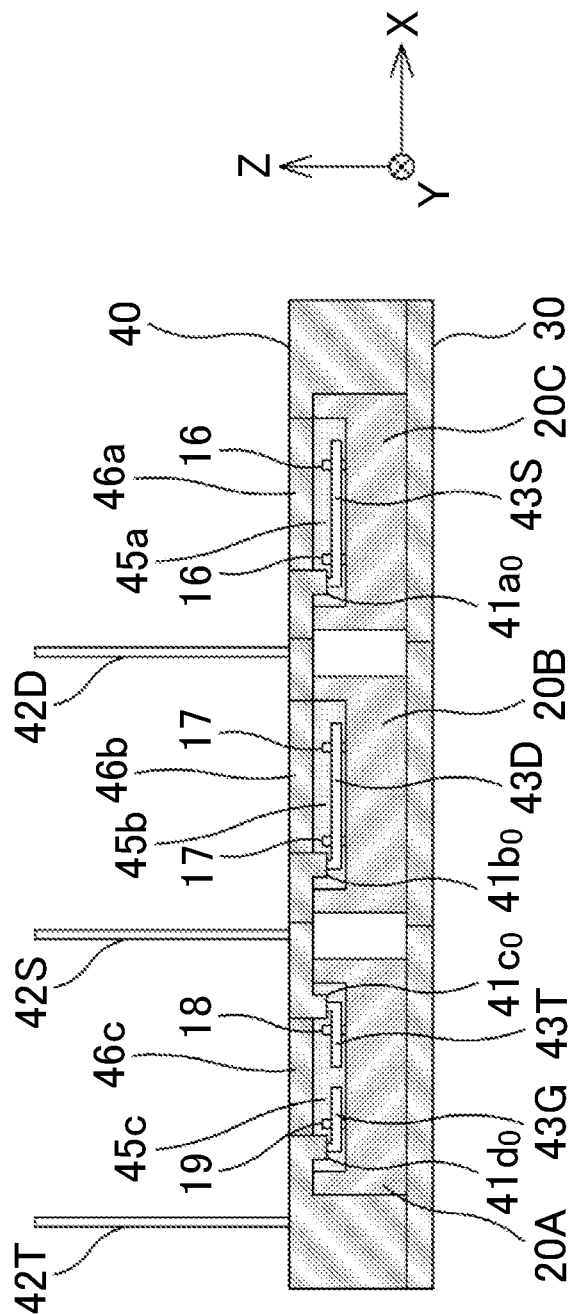
FIG. 6B shows a cross-sectional configuration of the semiconductor device over the reference line BB in FIG. 6A, in a state where the lid portion is provided to the through-hole of the unit connection portion.

In the fifth step, as shown in FIGS. 6A and 6B, first to third lid portions 46a to 46c are provided on each of the three third through-holes 41a to 41c of the unit connection portion 40, thereby covering these through-holes.

Figure 7:
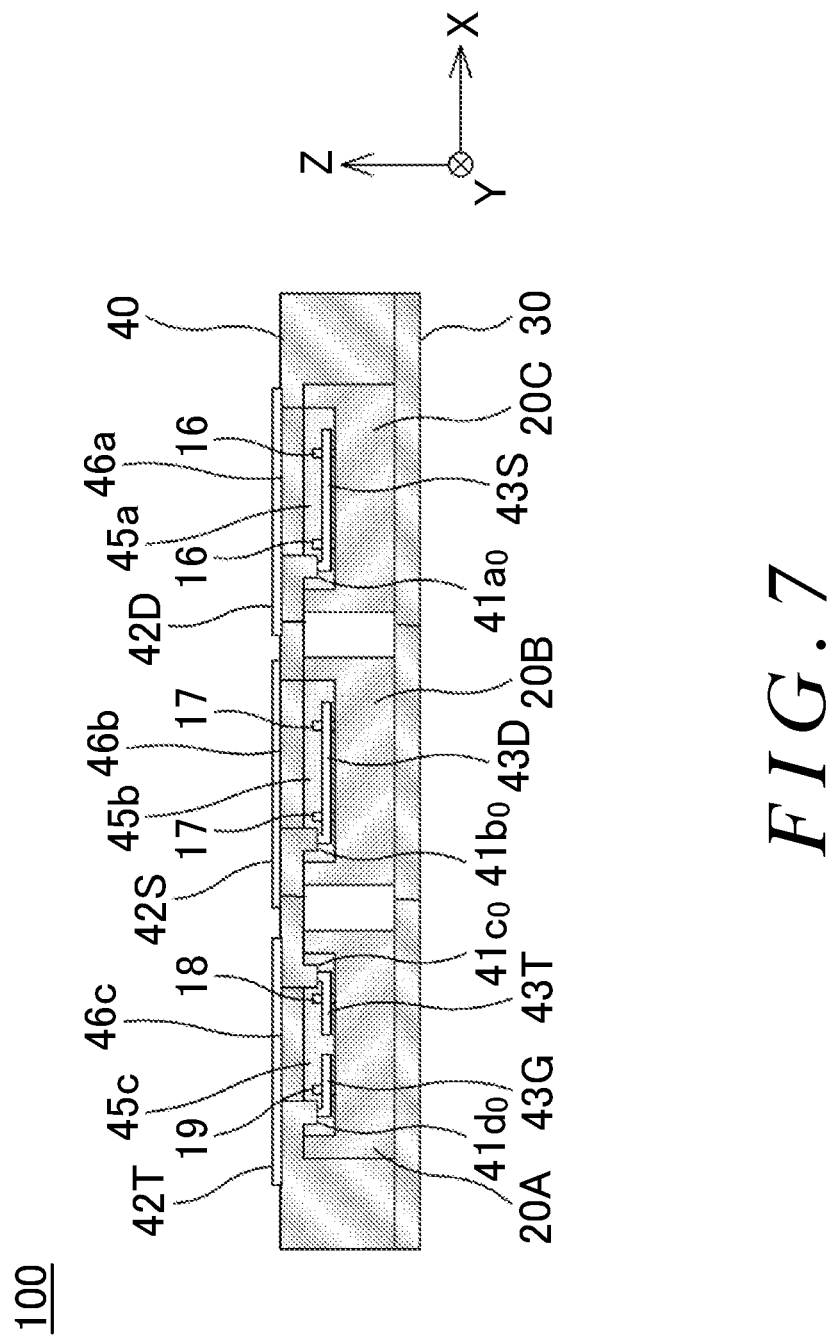
FIG. 7 shows a cross-sectional configuration of the semiconductor device over the reference line AA in FIG. 1B.

In the sixth step, as shown in FIG. 7, nuts (not shown in the drawings) are provided in each of the holes $41S_0$, $41D_0$, $41T_0$, and $41G_0$ in the top surface 41 of the unit connection portion 40, and electrode terminals 42S, 42D, 42T, and 42G are bent on the top surface of the top surface 41. In this way, the holes $42S_0$, $42D_0$, $42T_0$, and $42G_0$ of the electrode terminals 42S, 42D, 42T, and 42G are in communication with the holes $41S_0$, $41D_0$, $41T_0$, and $41G_0$ in the top surface 41. By overlapping the electrodes of an external apparatus or the like (not shown in the drawings) implemented in the semiconductor device 100 with the electrode terminals 42S, 42D, 42T, and 42G and screwing male screws of fixing jigs such as bolts (not shown in the drawings) into the female screws of the nuts (not shown in the drawings) provided inside the holes $41S_0$, $41D_0$, $41T_0$, and $41G_0$ in the top surface 41, via the holes $42S_0$, $42D_0$, $42T_0$, and $42G_0$ of the electrode terminals 42S, 42D, 42T, and 42G, it is possible to secure the electrodes of the external apparatus or the like to the electrode terminals 42S, 42D, 42T, and 42G.

With the steps described above, by including portions reaching to the first to fourth protruding portions $41a_0$ to $41d_0$ from the first to fourth connection terminals 43S, 43D, 43T, 43G with the first to third recessed sealing portions 45a to 45c inside the first to third recessed portions 11a to 11c of the semiconductor units 20A to 20C and sealing the connection portions between the first to fourth connection terminals 43S, 43D, 43T, and 43G and the first to fourth unit terminals 16 to 19, the semiconductor device 100 with high thermal resistance and high withstand voltage is formed.

In the semiconductor device 100 formed in the manner described above, the first to third recessed sealing portions 45a to 45c respectively seal the insides of the first to third recessed portions 11a to 11c of the semiconductor units 20A to 20C, as understood from FIG. 7. The first recessed sealing portions 45a seal the connection portions between the first unit terminals 16 and the first connection terminals 43S to include portions reaching the first protruding portions $41a_0$ from the first connection terminals 43S inside the recesses of the first recessed portions 11a of the semiconductor units 20A to 20C. The second recessed sealing portions 45b seal the connection portions between the second unit terminals 17 and the second connection terminals 43D to include portions reaching the second protruding portions $41b_0$ from the second connection terminals 43D inside the recesses of the second recessed portions 11b of the semiconductor units 20A to 20C. The third recessed sealing portions 45c is formed to seal the connection portions between the third unit terminals 18 and the third connection terminals 43T and the fourth unit terminals 19 and the fourth connection terminals 43G to include portions reaching the third protruding portions $41c_0$ from the third connection terminals 43T and portions reaching the fourth protruding portions $41d_0$ from the fourth connection terminals 43G inside the recesses of the third recessed portions 11c of the semiconductor units 20A to 20C. In this way, it is possible to ensure the insulation distance between the terminals and between the terminals and the ground on the front surface side of the semiconductor device 100, without exposing the electrode conductors within the semiconductor device 100.

Furthermore, the first to third lid portions 46a to 46c are members that respectively cover the top sides of the first to third through-holes 41a to 41c of the unit connection portion 40 (first to fourth unit connection portions 40a to 40d). The first to third lid portions 46a to 46c are formed with rectangular plate shapes from a hard insulating resin, in a similar manner as the unit connection portion 40.

A corrugated structure or stepped structure may be provided on the top surface 41 of the unit connection portion 40, and a larger insulation distance may be provided between the terminals and between the terminals and the ground.

The semiconductor device 100 according to the present embodiment includes the conductor base 30 that supports the semiconductor units 20A to 20C, but if the substrate 10 on which the semiconductor element is mounted in each of the semiconductor units 20A to 20C is mounted on a conductor base formed from Cu, AlSiC, or the like, for example, the conductor base 30 does not need to be provided.

Figure 8B:
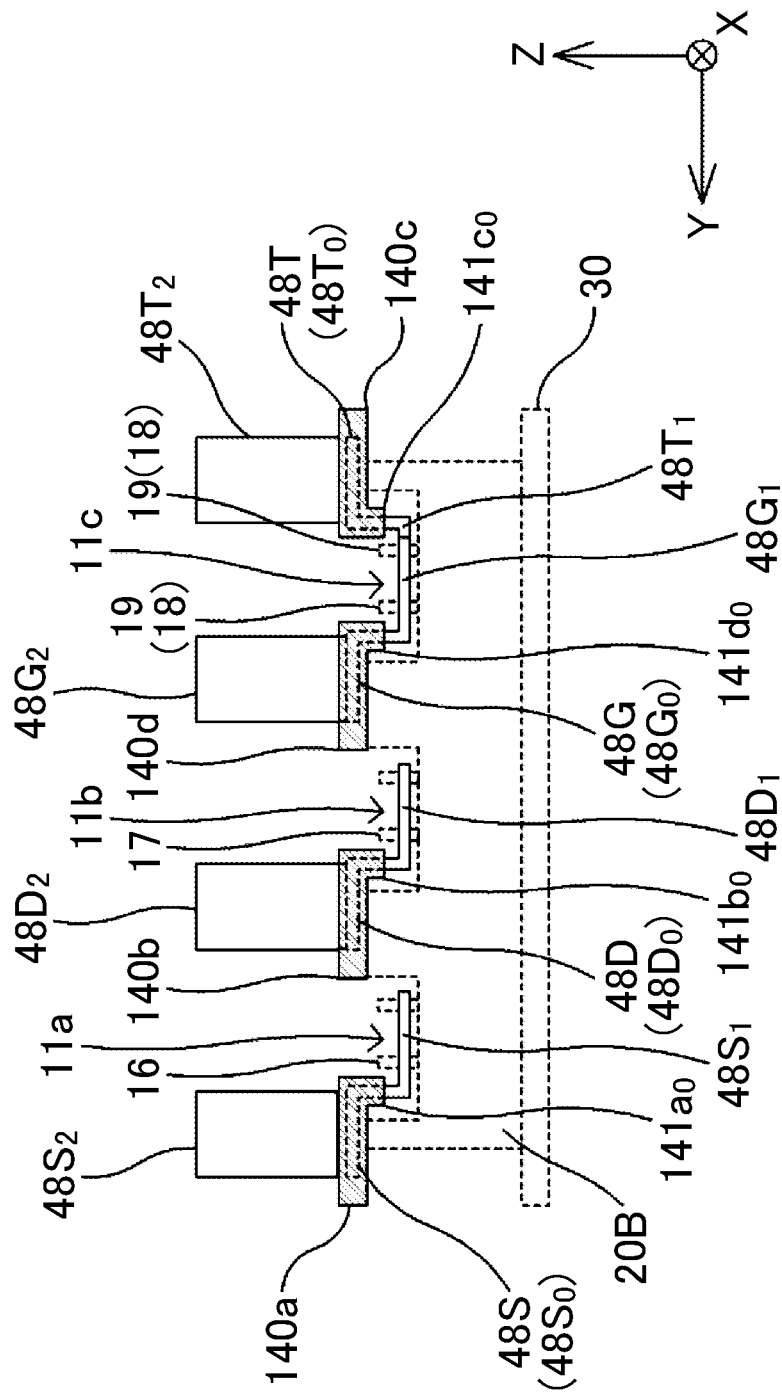
FIG. 8B shows a cross-sectional configuration of the unit connection portion according to the modification over the reference line BB in FIG. 8A.

FIGS. 8A and 8B show a configuration of the first to fourth unit connection portions 140a to 140d according to a modification. FIG. 8A shows an outer configuration of the first to fourth unit connection portions 140a to 140d in an overhead view, and FIG. 8B shows a cross-sectional configuration of the first to fourth unit connection portions 140a to 140d over the reference line BB in FIG. 8A. In FIGS. 8A and 8B, the semiconductor units 20A and 20B connected by the first to fourth unit connection portions 140a to 140d are shown using dashed lines. The first to fourth unit connection portions 140a to 140d are members that connect the first to fourth unit terminals 16 to 19 of the semiconductor units 20A to 20C to each other.

The first unit connection portion 140a includes a conduction plate 48S, which is formed with a cuboid shape that is long in the X-axis direction by a hard insulating resin such as epoxy resin, for example, and a portion thereof is included inside the first unit connection portion 140a. The conduction plate 48S is a member that is formed from a conductive metal such as copper or aluminum, and includes a main body $48S_0$, three connection terminals $48S_1$, and an electrode terminal $48S_2$. The main body $48S_0$ is a rectangular board that is long in the X-axis direction. The connection terminal $48S_1$ is a bent piece that extends in the −Z direction from three locations on the −Y edge of the main body $48S_0$ and bends in the −Y direction, and four holes through which the unit terminals 16 of the semiconductor units 20A to 20C pass are formed in the tip of the connection terminal $48S_1$. The electrode terminal $48S_2$ is a rectangular piece established at a position that is approximately ⅓ of the body length from the −X end of the main body $48S_0$. In the conduction plate 48S, the main body $48S_0$ is embedded in the first unit connection portion 140a, the tips of the three connection terminals $48S_1$ are lead to the −Y side of the first unit connection portion 140a, and the electrode terminal $48S_2$ protrudes in the +Z direction from the top surface of the first unit connection portion 140a. The first unit connection portion 140a includes a first protruding portion $141a_0$ that protrudes in the −Z direction on a −Y end portion and seals the base end of the connection terminals $48S_1$.

The second unit connection portion 140b includes a conduction plate 48D, which is formed with a cuboid shape that is long in the X-axis direction by a hard insulating resin in a similar manner as the first unit connection portion 140a, and a portion thereof is included inside the second unit connection portion 140b. The conduction plate 48D is a member that is formed from a conductive metal, in a similar manner as the conduction plate 48S, and includes a main body $48D_0$, three connection terminals $48D_1$, and an electrode terminal $48D_2$. These are formed in a similar manner as in the conduction plate 48S. However, four holes through which the unit terminals 17 of the semiconductor units 20A to 20C are inserted are formed in the tips of the three connection terminals $48D_1$. Furthermore, the electrode terminal $48D_2$ is established at a position that is approximately ⅓ of the body length from the +X end of the main body $48D_0$. In the conduction plate 48D, the main body $48D_0$ is embedded in the second unit connection portion 140b, the tips of the three connection terminal $48D_1$ are lead to the −Y side of the second unit connection portion 140b, and the electrode terminal $48D_2$ protrudes in the +Z direction from the top surface of the second unit connection portion 140b. The second unit connection portion 140b includes a second protruding portion $141b_0$ that protrudes in the −Z direction on a −Y end portion and seals the base end of the connection terminals $48D_1$.

The third unit connection portion 140c includes a conduction plate 48T, which is formed with a cuboid shape that is long in the X-axis direction by a hard insulating resin in a similar manner as the first and second unit connection portions 140a and 140b, and a portion thereof is included inside the third unit connection portion 140c. The conduction plate 48T is a member that is formed from a conductive metal, in a similar manner as the conduction plates 48S and 48D, and includes a main body $48T_0$, three connection terminals $48T_1$, and an electrode terminal $48T_2$. These are formed in a similar manner as in the conduction plates 48S and 48D. However, two holes through which the unit terminals 18 of the semiconductor units 20A to 20C are inserted are formed in the tips of the three connection terminals $48T_1$, which extend in the −Z direction from three locations on the +Y edge of the main body $48T_0$ and bend in the +Y direction. Furthermore, the electrode terminal $48T_2$ is established on the −X end of the main body $48T_0$. In the conduction plate 48T, the main body $48T_0$ is embedded in the third unit connection portion 140c, the tips of the three connection terminal $48T_1$ are lead to the +Y side of the third unit connection portion 140c, and the electrode terminal $48T_2$ protrudes in the +Z direction from the top surface of the third unit connection portion 140c. The third unit connection portion 140c includes a third protruding portion $141c_0$ that protrudes in the −Z direction on the +Y end portion and seals the base end of the connection terminals $48T_1$.

The fourth unit connection portion 140d includes a conduction plate 48G, which is formed with a cuboid shape that is long in the X-axis direction by a hard insulating resin in a similar manner as the first to third unit connection portions 140a to 140c, and a portion thereof is included inside the fourth unit connection portion 140d. The conduction plate 48G is a member that is formed from a conductive metal, in a similar manner as the conduction plates 48S, 48D, and 48T, and includes a main body $48G_0$, three connection terminals $48G_1$, and an electrode terminal $48G_2$. These are formed in a similar manner as in the conduction plate 48T. However, in the connection terminal $48G_1$, two holes through which the unit terminals 19 of the semiconductor units 20A to 20C are inserted are formed in the tips of the three connection terminals $48G_1$, which extend in the −Z direction from three locations on the −Y edge of the main body $48G_0$ and bend in the −Y direction. Furthermore, the electrode terminal $48G_2$ is established on the −X end of the main body $48G_0$. In the conduction plate 48G, the main body $48G_0$ is embedded in the fourth unit connection portion 140d, the tips of the three connection terminal $48G_1$ are lead to the −Y side of the fourth unit connection portion 140d, and the electrode terminal $48G_2$ protrudes in the +Z direction from the top surface of the fourth unit connection portion 140d. The fourth unit connection portion 140d includes a fourth protruding portion $141d_0$ that protrudes in the −Z direction on the −Y end portion and seals the base end of the connection terminals $48G_1$.

When the first unit connection portions 140a are mounted on the +Y side of the first recessed portions 11a of the semiconductor units 20A to 20C, the three connection terminals $48S_1$ are inserted into the first recessed portions 11a of the respective semiconductor units 20A to 20C, and the four first unit terminals 16 protruding therein are inserted respectively through the four holes of each connection terminals $48S_1$. Then, the connection terminals $48S_1$ are connected to the first unit terminals 16 via the spaces between the first and second unit connection portions 140a and 140b by performing a connection process using laser fusion, solder bonding, or the like. In this way, the electrode terminals $48S_2$ are connected to the first unit terminals 16 of the respective semiconductor units 20A to 20C, and function as a common source terminal.

Similarly, when the second unit connection portions 140b are mounted on the +Y side of the second recessed portions 11b of the semiconductor units 20A to 20C, the three connection terminals $48D_1$ are inserted into the second recessed portions 11b of the respective semiconductor units 20A to 20C, and the four second unit terminals 17 protruding therein are inserted respectively through the four holes of each connection terminal $48D_1$. Then, the connection terminals $48D_1$ are connected to the second unit terminals 17 via the spaces between the second and fourth unit connection portions 140b and 140d by performing a connection process. In this way, the electrode terminals $48D_2$ are connected to the second unit terminals 17 of the respective semiconductor units 20A to 20C, and function as a common drain terminal.

Furthermore, when the third unit connection portions 140c are mounted on the −Y side of the third recessed portions 11c of the semiconductor units 20c to 20C and the fourth unit connection portions 140d are mounted on the +Y side of the third recessed portions 11c of the semiconductor units 20c to 20C, each of the three sets of third and fourth connection terminals $48T_1$ and $48G_1$ are inserted into the third recessed portions 11c of the respective semiconductor units 20c to 20C, and each of the two sets of third and fourth unit terminals 18 and 19 protruding therein are inserted respectively through each set of two holes of the connection terminals $48T_1$ and $48G_1$. Then, the connection terminals $48T_1$ and $48G_1$ are connected to the third and fourth unit terminals 18 and 19 via the spaces between the third and fourth unit connection portions 140c and 140d by performing a connection process. In this way, the electrode terminals $48T_2$ are connected to the third unit terminals 18 of the respective semiconductor units 20c to 20C to function as a common source sensing terminal, and the electrode terminals $48G_2$ are connected to the fourth unit terminals 19 of the respective semiconductor units 20c to 20C to function as a common gate terminal.

With the first to fourth unit connection portions 140a to 140d according to the modification, instead of forming a large integrated unit such as the unit connection portion 40 described above, the first to fourth unit terminals 16 to 19 of the semiconductor units 20A to 20C are formed as a plurality of units that are each connected independently, thereby decreasing the size of each unit and making each unit easier to handle.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, with the embodiments of the present invention, it is possible to realize a semiconductor device and a semiconductor device manufacturing method.

What is claimed is:

1. A semiconductor device comprising: a plurality of semiconductor units that each include semiconductor elements, a unit case that seals the semiconductor elements, and a first unit terminal that is exposed inside a first recessed portion provided in a top surface of the unit case; a first unit connection portion that includes, in correspondence with each of the plurality of semiconductor units, a first connection terminal connected to the first unit terminal, a first connection conductor connected between a plurality of the first connection terminals, and a first connection conductor sealing portion that seals the first connection conductor while exposing the plurality of first connection terminals; and a plurality of first recessed sealing portions that each, in correspondence with each of the plurality of semiconductor units, seal each connection portion between the first unit terminal and the first connection terminal inside a recess of the first recessed portion, wherein the first connection conductor sealing portion includes, in correspondence with each of the plurality of semiconductor units, a first protruding portion that protrudes toward an inside of the first recessed portion and seals an extension portion of the first connection conductor that extends toward the first connection terminal, and each of the plurality of first recessed sealing portions seals a portion reaching the first protruding portion from the first connection terminal corresponding thereto in the first unit connection portion.

2. The semiconductor device according to claim 1, wherein
the first unit connection portion (40a) is provided at a position where at least a portion of the first connection terminal (43S) corresponding to each of the plurality of semiconductor units (20A to 20C) is not hidden by the first connection conductor (43S$_0$) and the first connection conductor sealing portion (40a$_0$) in an overhead view.

3. The semiconductor device according to claim 2, wherein
the first connection terminal (43S) includes an end portion distanced from the first connection conductor (43S$_0$) and the first connection conductor sealing portion (40a$_0$).

4. The semiconductor device according to claim 2, wherein
the first connection conductor sealing portion (40a$_0$) includes a first through-hole (41a) for exposing at least a portion of the first connection terminal (43S) at a position corresponding to the first connection terminal (43S) corresponding to each of the plurality of semiconductor units (20A to 20C), in an overhead view.

5. The semiconductor device according to claim 4, further comprising:

a plurality of first lid portions (46a) that respectively cover top sides of a plurality of the first through-holes (41a) corresponding to the plurality of first connection terminals (43S).

6. The semiconductor device according to claim 1, wherein
each of the plurality of semiconductor units (20A to 20C) further includes a second unit terminal (17) that is exposed in a second recessed portion (11b) provided in the top surface of the unit case (11), and the semiconductor device further comprises:
a second unit connection portion (40b) that includes, in correspondence with each of the plurality of semiconductor units (20A to 20C), a second connection terminal (43D) connected to the second unit terminal (17), a second connection conductor (43D$_0$) connected between a plurality of the second connection terminals (43D), and a second connection conductor sealing portion (40b$_0$) that seals the second connection conductor (43D$_0$) while exposing the plurality of second connection terminals (43D); and
a plurality of second recessed sealing portions (45b) that each, in correspondence with each of the plurality of semiconductor units (20A to 20C), seal each connection portion between the second unit terminal (17) and the second connection terminal (43D) inside a recess of the second recessed portion (11b).

7. The semiconductor device according to claim 6, wherein
each of the plurality of semiconductor units (20A to 20C) further includes a third unit terminal (18) that is exposed in a third recessed portion (11c) provided in the top surface of the unit case (11), and the semiconductor device further comprises:
a third unit connection portion (40c) that includes, in correspondence with each of the plurality of semiconductor units (20A to 20C), a third connection terminal (43T) connected to the third unit terminal (18), a third connection conductor (43T$_0$) connected between a plurality of the third connection terminals (43T), and a third connection conductor sealing portion (40c$_0$) that seals the third connection conductor (43T$_0$) and exposes the plurality of third connection terminals (43T); and
a plurality of third recessed sealing portions (45c) that each, in correspondence with each of the plurality of semiconductor units (20A to 20C), seal each connection portion between the third unit terminal (18) and the third connection terminal (43T) inside a recess of the third recessed portion (11c).

8. The semiconductor device according to claim 7, wherein
each of the plurality of semiconductor units (20A to 20C) further includes a fourth unit terminal (19) that is exposed in the third recessed portion (11c),
the semiconductor device further comprises a fourth unit connection portion (40d) that includes, in correspondence with each of the plurality of semiconductor units (20A to 20C), a fourth connection terminal (43G) connected to the fourth unit terminal (19), a fourth connection conductor (43G$_0$) connected between a plurality of the fourth connection terminals (43G), and a fourth connection conductor sealing portion (40d$_0$) that seals the fourth connection conductor (43G$_0$) and exposes the plurality of fourth connection terminals (43G), and each of the plurality of third recessed sealing portions (45c) seals a connection portion between the third unit terminal (18) and the third connection terminal (43T) and a connection portion between the fourth unit terminal (19) and the fourth connection terminal (43G), in a recess of the third recessed portion (11c).

9. The semiconductor device according to claim 8, wherein
at least two connection conductor sealing portions among the first connection conductor sealing portion ($40a_0$), the second connection conductor sealing portion ($40b_0$), the third connection conductor sealing portion ($40c_0$), and the fourth connection conductor sealing portion ($40d_0$) are formed integrally.

10. The semiconductor device according to claim 9, wherein
at least two connection conductors corresponding to the at least two connection conductor sealing portions among the first connection conductor ($43S_0$), the second connection conductor ($43D_0$), the third connection conductor ($43T_0$), and the fourth connection conductor ($43G_0$) are arranged such that, in an overhead view, at least portions thereof overlap inside the at least two connection conductor sealing portions that are formed integrally.

11. The semiconductor device according to claim 1, wherein
each of the plurality of semiconductor units (20A to 20C) includes two or more of the first unit terminals (16) at the same potential as each other exposed inside the first recessed portion (11a).

12. The semiconductor device according to claim 1, wherein
each of the plurality of semiconductor units (20A to 20C) includes a substrate (10) in which metal plates (10b and 10c) are affixed to a top surface and a bottom surface of an insulating plate (10a), with the semiconductor elements (12 and 13) mounted on the metal plate (10b) on a top surface side, and
the semiconductor device further comprises a conductor base (30) that contacts the metal plate (10c) on the bottom surface of the substrate (10) in each of the plurality of semiconductor units (20A to 20C).

13. A semiconductor device manufacturing method comprising: manufacturing a plurality of semiconductor units that each include semiconductor elements, a unit case that seals the semiconductor elements, and a first unit terminal that is exposed inside a first recessed portion provided in a top surface of the unit case, manufacturing a first unit connection portion that includes, in correspondence with each of the plurality of semiconductor units, a first connection terminal connected to the first unit terminal, a first connection conductor connected between a plurality of the first connection terminals, and a first connection conductor sealing portion that seals the first connection conductor while exposing the plurality of first connection terminals; for each of the plurality of semiconductor units, connecting the first unit terminal and the first connection terminal in a recess of the first recessed portion; and forming a plurality of first recessed sealing portions by, in correspondence with each of the plurality of semiconductor units, sealing each connection portion between the first unit terminal and the first connection terminal inside the recess of the first recessed portion, wherein the manufacturing the first unit connection portion includes providing a first through-hole in the first connection conductor sealing portion for exposing at least a portion of the first connection terminals at a position corresponding to the first connection terminals in an overhead view.

14. The semiconductor device manufacturing method according to claim 13, wherein
the connecting the first connection terminal (43S) includes performing a process to connect the first unit terminal (16) and the first connection terminal (43S) via the first through-hole (41a).

15. The semiconductor device manufacturing method according to claim 13, wherein
the forming the plurality of first recessed sealing portions (45a) includes filling a recess of the first recessed portion (11a) with resin, via the first through-hole (41a).

16. The semiconductor device manufacturing method according to claim 13, further comprising:
covering a top side of the first through-hole 41a with a first lid portion (46a).

17. The semiconductor device manufacturing method according to claim 13, wherein
each of the plurality of semiconductor units (20A to 20C) further includes a substrate (10) in which metal plates (10b and 10c) are affixed to a top surface and a bottom surface of an insulating plate (10a), with the semiconductor elements (12 and 13) mounted on the metal plate (10b) on a top surface side, and
the semiconductor device manufacturing method further comprises mounting each of the plurality of semiconductor units (20A to 20C) on a conductor base (30) in contact with the metal plate (10c) on the bottom surface of the substrate (10).

* * * * *